(12) United States Patent
Lee et al.

(10) Patent No.: US 12,356,626 B2
(45) Date of Patent: Jul. 8, 2025

(54) SEMICONDUCTOR DEVICES INCLUDING CAPACITOR ELECTRODES

(71) Applicant: SAMSUNG ELECTRONICS CO., LTD., Suwon-si (KR)

(72) Inventors: Seungmin Lee, Seoul (KR); Kangmin Kim, Hwaseong-si (KR); Junhyoung Kim, Seoul (KR); Yonghoon Son, Yongin-si (KR); Joonsung Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 469 days.

(21) Appl. No.: 17/720,453

(22) Filed: Apr. 14, 2022

(65) Prior Publication Data

US 2023/0005949 A1 Jan. 5, 2023

(30) Foreign Application Priority Data

Jul. 5, 2021 (KR) .......................... 10-2021-0087743

(51) Int. Cl.
*H10B 43/50* (2023.01)
*H01L 23/535* (2006.01)
(Continued)

(52) U.S. Cl.
CPC ........... *H10B 43/50* (2023.02); *H01L 23/535* (2013.01); *H10B 43/27* (2023.02); *H10B 43/40* (2023.02); *H10D 1/692* (2025.01); *H10D 88/00* (2025.01)

(58) Field of Classification Search
CPC ........ H10B 43/50; H10B 43/27; H10B 43/40; H10B 43/10; H10B 43/20; H10B 43/30;
(Continued)

(56) References Cited

U.S. PATENT DOCUMENTS 9,659,954 B2    5/2017  Kim et al.
9,741,733 B2 *  8/2017  Lim ..................... H01L 23/528
(Continued)

FOREIGN PATENT DOCUMENTS

KR       20210032920 A  *  3/2021 ............. H10B 43/50
KR       10-2022-0159826    12/2022

*Primary Examiner* — Ida M Soward
(74) *Attorney, Agent, or Firm* — MORGAN, LEWIS & BOCKIUS LLP

(57) ABSTRACT

A semiconductor device includes a first structure including a peripheral circuit and a second structure on the first structure. The second structure includes: a stack structure including first and second stack structures; separation structures passing through the first stack structure; a memory vertical structure between the separation structures and passing through the first stack structure; and a capacitor including first and second capacitor electrodes passing through the second stack structure and extending parallel to each other. The first stack structure includes spaced apart gate electrodes and interlayer insulating layers alternately stacked therewith. The second stack structure includes spaced apart first insulating layers, and second insulating layers alternately stacked therewith. Each of the first and second capacitor electrodes has a linear shape. The first and second insulating layers include a different material from each other. The second insulating layers include the same material as the interlayer insulating layers.

19 Claims, 14 Drawing Sheets

(51) Int. Cl.
*H10B 43/27* (2023.01)
*H10B 43/40* (2023.01)
*H10D 1/68* (2025.01)
*H10D 88/00* (2025.01)

(58) Field of Classification Search
CPC ........ H10B 41/20; H10B 41/30; H10B 41/40; H10B 41/50; H01L 23/535; H01L 28/60; H01L 28/40; H01L 27/0688; H10D 1/692; H10D 1/68; H10D 88/00
See application file for complete search history.

(56) References Cited

U.S. PATENT DOCUMENTS

| | | |
|---|---|---|
| 10,068,913 B2 | 9/2018 | Son et al. |
| 10,224,339 B2 * | 3/2019 | Zhang .................... H10B 43/40 |
| 10,325,775 B2 | 6/2019 | Sung et al. |
| 10,418,374 B2 | 9/2019 | Lee et al. |
| 2017/0025545 A1 * | 1/2017 | Nam .................... H10D 30/6728 |
| 2018/0277596 A1 * | 9/2018 | Mori ....................... H10B 63/34 |
| 2019/0304991 A1 * | 10/2019 | Seo ........................ H10B 41/27 |
| 2019/0333929 A1 * | 10/2019 | Lee ........................ H10B 41/20 |
| 2020/0194454 A1 * | 6/2020 | Zhang .................... H10B 43/50 |
| 2020/0273881 A1 | 8/2020 | Kim |
| 2020/0312861 A1 | 10/2020 | Kim |
| 2021/0028184 A1 | 1/2021 | Kim |
| 2021/0028186 A1 * | 1/2021 | Lim ....................... H10B 43/10 |
| 2021/0035910 A1 * | 2/2021 | Kim ....................... H10B 43/10 |
| 2021/0151462 A1 * | 5/2021 | Baek ...................... H10B 41/50 |
| 2021/0257384 A1 * | 8/2021 | Jeong .................. H01L 23/5283 |
| 2021/0265389 A1 * | 8/2021 | Kim ....................... H10B 41/10 |
| 2022/0020762 A1 * | 1/2022 | Son ....................... H10B 43/10 |
| 2022/0045083 A1 * | 2/2022 | Sim ....................... H10B 43/50 |
| 2022/0052067 A1 * | 2/2022 | Chun .................... H10B 43/35 |
| 2022/0115294 A1 * | 4/2022 | Kim ..................... H01L 25/105 |
| 2022/0384467 A1 | 12/2022 | Kim et al. |

* cited by examiner

SEMICONDUCTOR DEVICES INCLUDING CAPACITOR ELECTRODES

CROSS-REFERENCE TO RELATED APPLICATION(S)

This application claims priority under 35 U.S.C. § 119 to Korean Patent Application No. 10-2021-0087743, filed on Jul. 5, 2021 in the Korean Intellectual Property Office, the disclosure of which is incorporated herein by reference in its entirety herein.

1. TECHNICAL FIELD

The present disclosure relates to a semiconductor device and a data storage system including the same.

2. DISCUSSION OF RELATED ART

An electronic system requiring data storage may include a semiconductor device for storing high-capacity data. Accordingly, various methods for increasing the data storage capacity of semiconductor devices are being researched. For example, a semiconductor device including memory cells arranged three-dimensionally, instead of memory cells arranged two-dimensionally, has been proposed to increase the data storage capacity of a semiconductor device.

SUMMARY

An aspect of the present disclosure is to provide a semiconductor device and a data storage system for increasing a degree of integration and reliability.

According to an aspect of the present disclosure, a semiconductor device includes a first structure including a peripheral circuit; and a second structure disposed on the first structure. The second structure includes: a stack structure including a first stack structure and a second stack structure; separation structures passing through the first stack structure; a memory vertical structure disposed between the separation structures and passing through the first stack structure; and a capacitor including a first capacitor electrode and a second capacitor electrode, passing through the second stack structure. The first and second capacitor electrodes extend parallel to each other. The first stack structure includes gate electrodes spaced apart from each other and stacked in a first direction, and interlayer insulating layers alternately stacked with the gate electrodes. The second stack structure includes first insulating layers spaced apart from each other and stacked in the first direction, and second insulating layers alternately stacked with the first insulating layers. Each of the first and second capacitor electrodes has a linear shape extending in a second direction that is perpendicular to the first direction. The first insulating layers include a different material than the second insulating layers. The second insulating layers include the same material as the interlayer insulating layers.

According to an aspect of the present disclosure, a semiconductor device includes a substrate; a peripheral circuit on the substrate; a lower insulating layer covering the peripheral circuit on the substrate; a pattern structure including a first pattern structure disposed on the lower insulating layer, and a second pattern structure spaced apart from the first pattern structure, and disposed on the lower insulating layer. A first stack structure includes interlayer insulating layers and gate electrodes, alternately stacked on the first pattern structure. The gate electrodes are spaced apart from each other in a first direction that is perpendicular to the first pattern structure in a first region, and includes gate pads arranged in a step shape in a second region adjacent to the first region. A memory vertical structure passes through the first stack structure in the first region, and contacts the first pattern structure. A first capacitor electrode and a second capacitor electrode are disposed on the second pattern structure. The first and second capacitor electrodes extend parallel to each other. A first separation insulating layer covers a side surface and a lower surface of the first capacitor electrode and separating the first capacitor electrode from the second pattern structure. A second separation insulating layer covers a side surface and a lower surface of the second capacitor electrode and separates the second capacitor electrode from the second pattern structure. The first pattern structure includes a first ground pattern disposed below the first pattern structure and passing through at least a portion of the lower insulating layer. The first pattern structure is grounded to the substrate. The second pattern structure includes a second ground pattern disposed below the second pattern structure and passing through at least a portion of the lower insulating layer. The second pattern structure is grounded to the substrate. The first pattern structure includes a first pattern layer, a second pattern layer on the first pattern layer, and a third pattern layer on the second pattern layer, and the second pattern structure includes a fourth pattern layer, a fifth pattern layer on the fourth pattern layer, and a sixth pattern layer on the fifth pattern layer. The first and fourth pattern layers are disposed on the same height level and include the same material, the fifth pattern layer includes a different material from that of the second pattern layer, the third and sixth pattern layers include the same material, the memory vertical structure passes through at least the second and third pattern layers, and the first and second capacitor electrodes pass through at least the sixth pattern layer.

According to an aspect of the present disclosure, a data storage system includes a main substrate; a semiconductor device on the main substrate; and a controller electrically connected to the semiconductor device on the main substrate. The semiconductor device includes a first structure including a peripheral circuit; and a second structure disposed on the first structure. The second structure includes: a stack structure including a first stack structure and a second stack structure; separation structures passing through the first stack structure; a memory vertical structure disposed between the separation structures and passing through the first stack structure; and a capacitor including a first capacitor electrode and a second capacitor electrode, passing through the second stack structure. The first and second capacitor electrodes extend parallel to each other. The first stack structure includes gate electrodes spaced apart from each other and stacked in a first direction, and interlayer insulating layers alternately stacked with the gate electrodes. The second stack structure includes first insulating layers spaced apart from each other and stacked in the first direction, and second insulating layers alternately stacked with the first insulating layers. Each of the first and second capacitor electrodes has a linear shape extending in a second direction that is perpendicular to the first direction. The first insulating layers include a different material than the second insulating layers. The second insulating layers include the same material as the interlayer insulating layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION OF EMBODIMENTS

Hereinafter, non-limiting embodiments of the present disclosure will be described with reference to the accompanying drawings.

First, a semiconductor device according to an embodiment of the present disclosure will be described with reference to FIGS. 1 to 3B.

Figure 1:
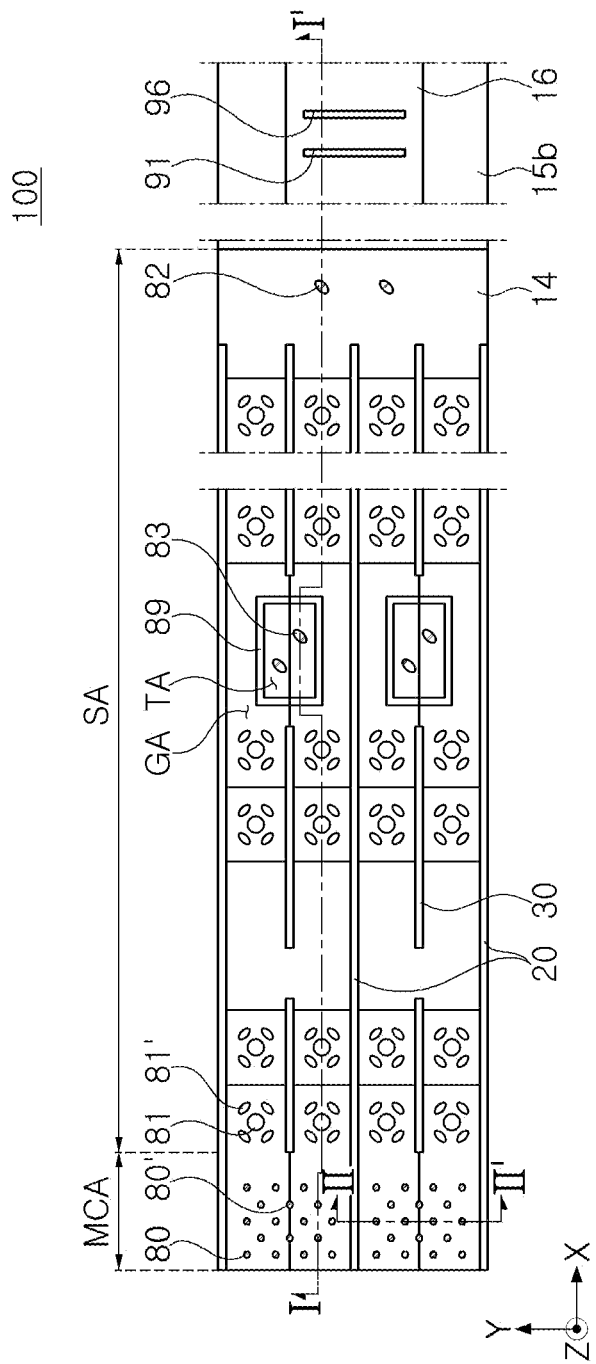
FIG. 1 is a plan view illustrating a semiconductor device according to an embodiment of the present disclosure.
Figure 2A:
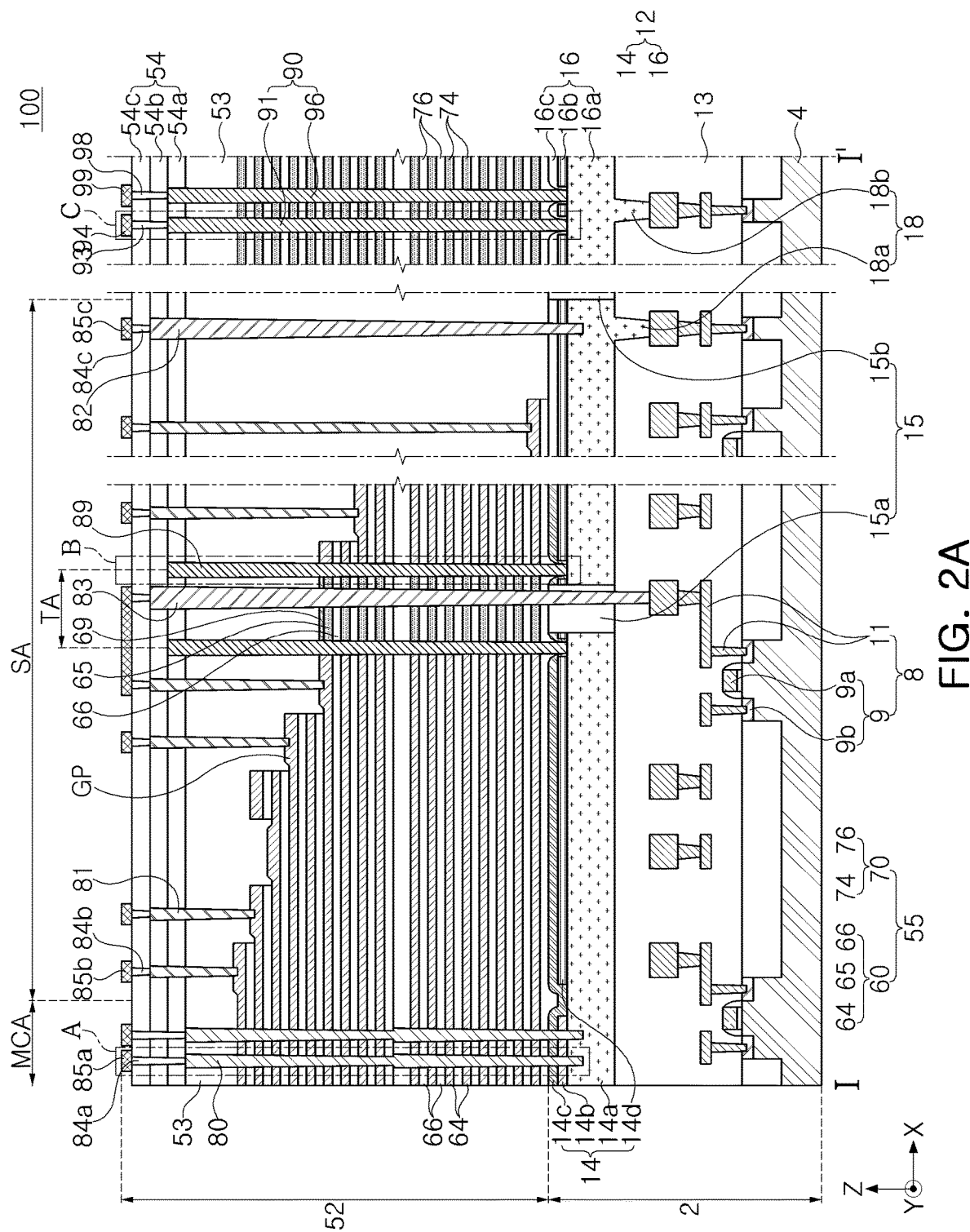
FIG. 2A is a cross-sectional view illustrating a semiconductor device taken along line I-I' of FIG. 1 according to an embodiment of the present disclosure.
Figure 2B:
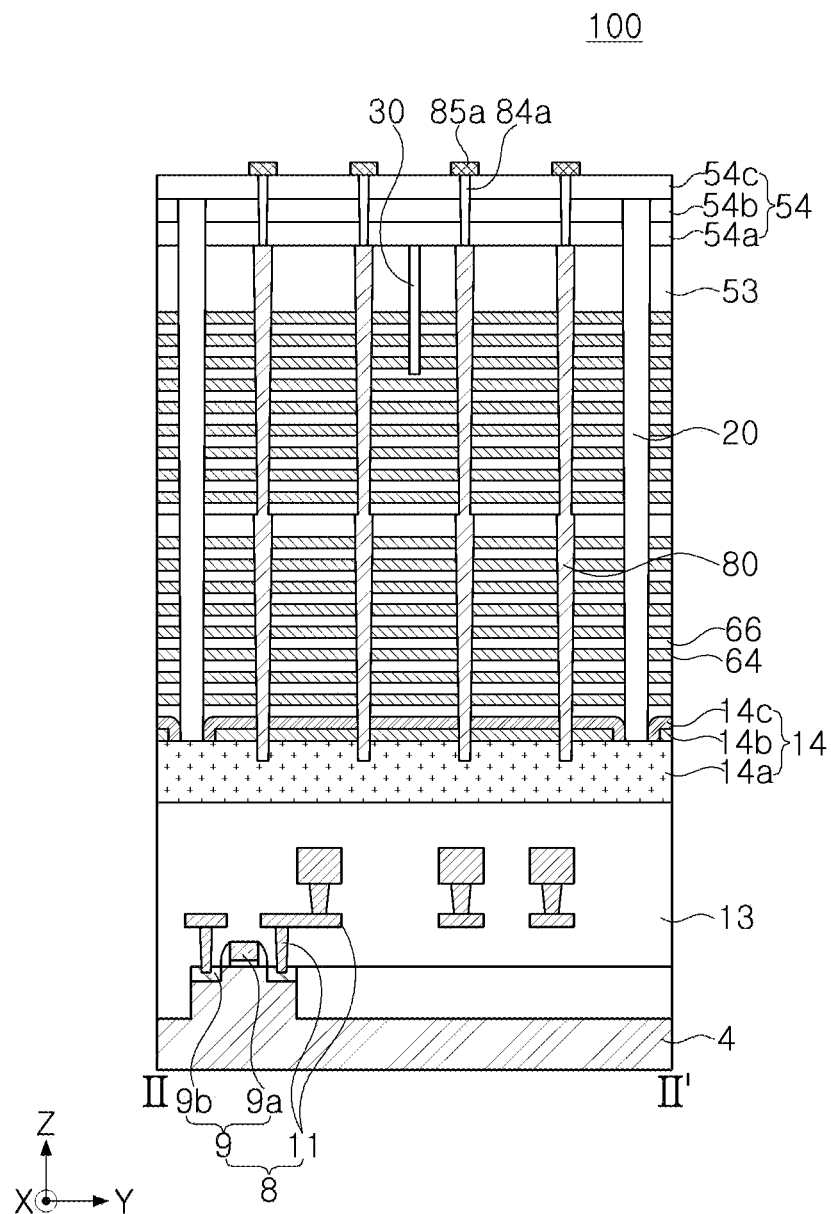
FIG. 2B is a cross-sectional view illustrating a semiconductor device taken along line II-II' of FIG. 1 according to an embodiment of the present disclosure.
Figure 3A:
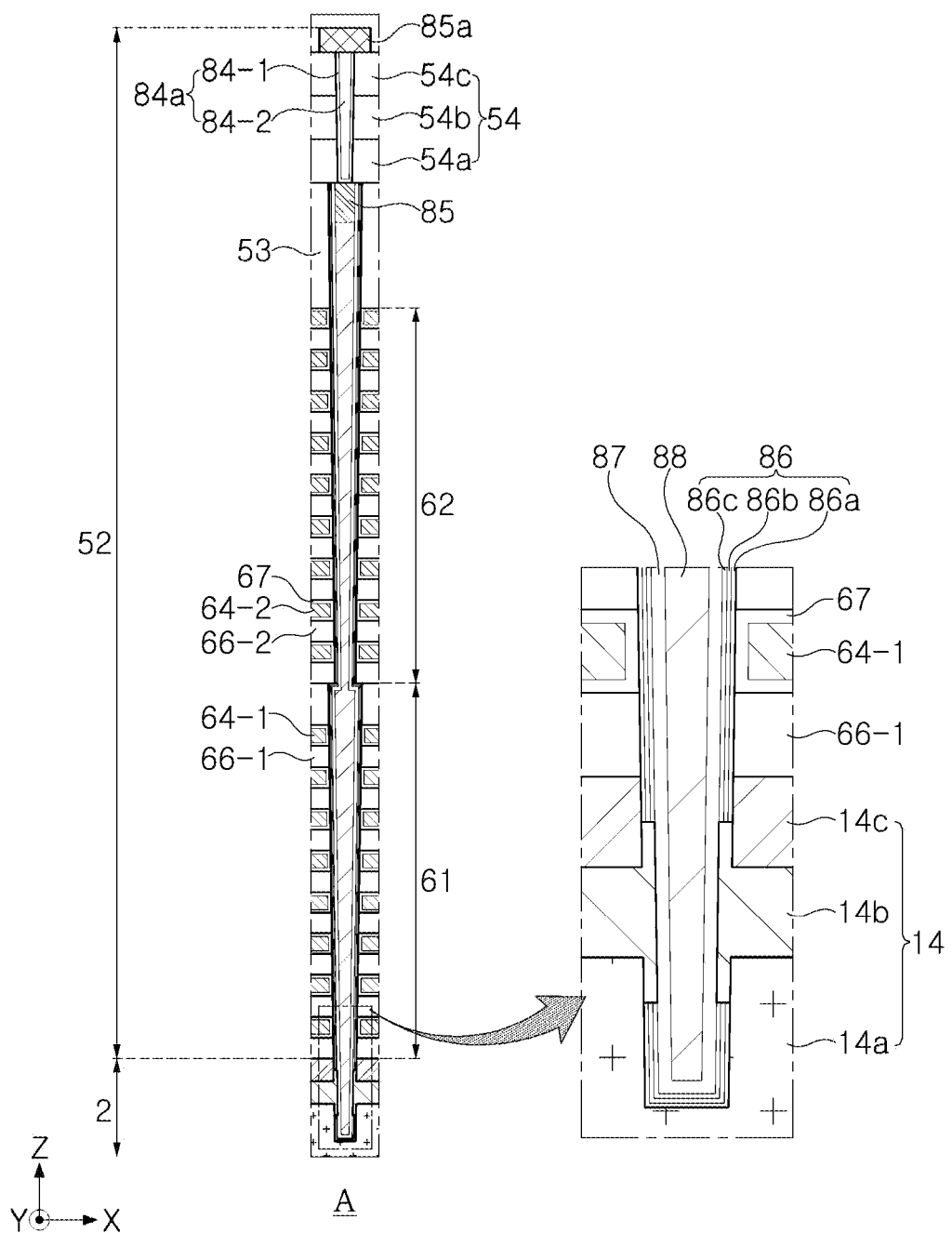
FIG. 3A is an partially enlarged view of portion A of FIG. 2A according to an embodiment of the present disclosure.
Figure 3B:
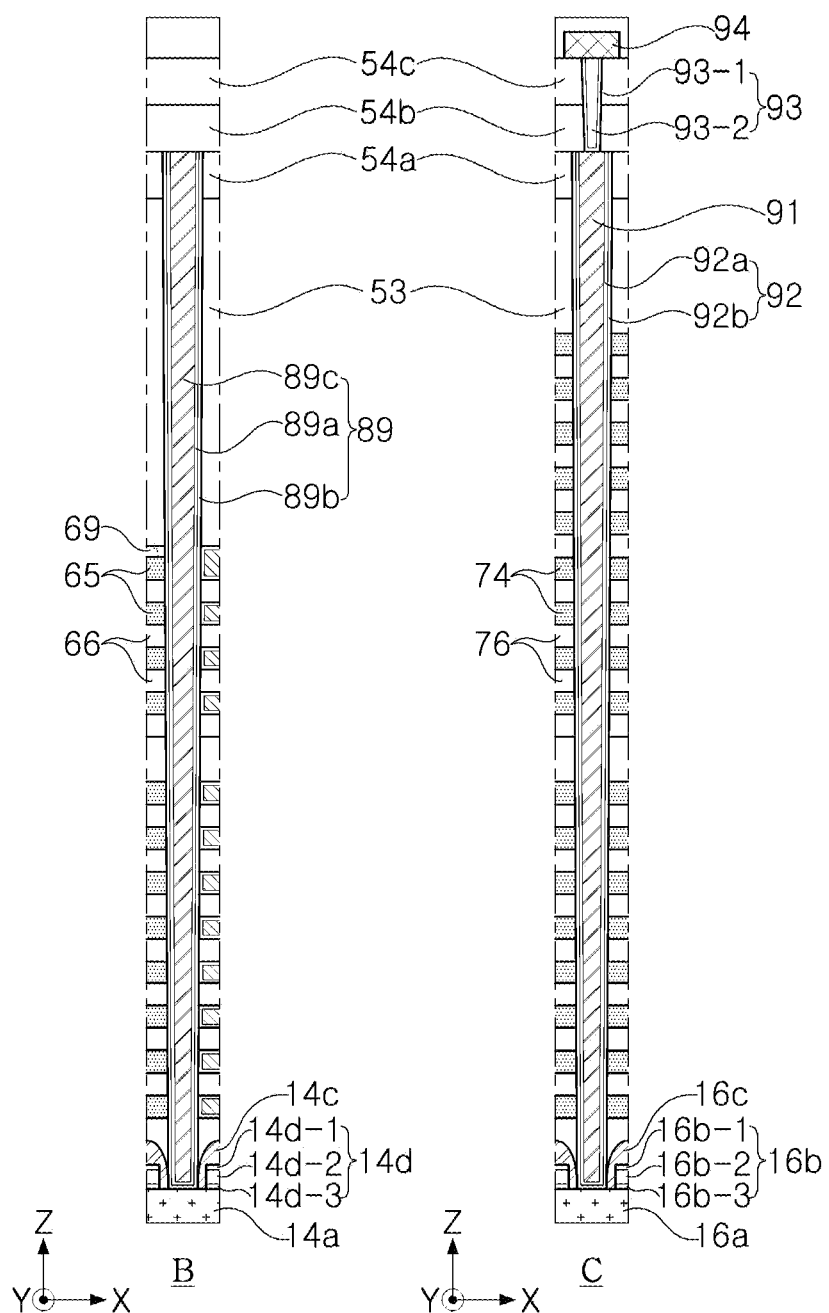
FIG. 3B is an partially enlarged view of portions 'B' and 'C' of FIG. 2A according to embodiments of the present disclosure.

FIG. 1 is a schematic plan view illustrating a semiconductor device 100 according to an example embodiment, FIG. 2A is a cross-sectional view illustrating a region corresponding to line I-I' of FIG. 1, FIG. 2B is a cross-sectional view illustrating a region corresponding to line II-II' of FIG. 1, FIG. 3A is an partially enlarged view of portion 'A' of FIG. 2A, and FIG. 3B is an partially enlarged view of portions 'B' and 'C' of FIG. 2A.

Referring to FIGS. 1 to 3B, a semiconductor device 100 according to an embodiment may include a first structure 2 and a second structure 52 on the first structure 2. The second structure 52 may overlap the first structure 2 in a vertical direction Z.

The first structure 2 may include a substrate 4, a peripheral circuit 8 disposed on the substrate 4, a lower insulating layer 13 covering the peripheral circuit 8, and a pattern structure 12 disposed on the lower insulating layer 13 and including a silicon layer.

The peripheral circuit 8 may include a circuit element 9, such as a transistor or the like, including a peripheral gate 9a and a peripheral source/drain 9b, and a circuit wiring 11 electrically connected to the circuit element 9. The lower insulating layer 13 may cover the peripheral circuit 8 on the substrate 4. In an embodiment, the lower insulating layer 13 may include an insulating material such as silicon oxide or the like. However, embodiments of the present disclosure are not limited thereto.

The pattern structure 12 may include a first pattern structure 14 and a second pattern structure 16, spaced apart from the first pattern structure. The pattern structure 12 may be disposed on a higher level (e.g., distance from an upper surface of the substrate 4 in the Z-axis direction) than that of the peripheral circuit 8.

The first pattern structure 14 may include a first pattern layer 14a, a second pattern layer 14b, and a third pattern layer 14c, sequentially stacked (e.g., in the Z-axis direction). The third pattern layer 14c may cover the second pattern layer 14b on the first pattern layer 14a. In an embodiment, the first pattern layer 14a may have a thickness (e.g., length in the Z-axis direction) that is greater than a thickness (e.g., length in the Z-axis direction) of the second pattern layer 14b and a thickness (e.g., length in the Z-axis direction) of the third pattern layer 14c. In an embodiment, at least one of the first pattern layer 14a, the second pattern layer 14b, or the third pattern layer 14c may include a silicon layer. For example, the first pattern layer 14a, the second pattern layer 14b, and the third pattern layer 14c may include a silicon layer, for example, a silicon layer having N-type conductivity. However, embodiments of the present disclosure are not limited thereto.

The second pattern structure 16 may include a fourth pattern layer 16a, a fifth pattern layer 16b, and a sixth pattern layer 16c, sequentially stacked (e.g., in the Z-axis direction). The sixth pattern layer 16c may cover the fifth pattern layer 16b on the fourth pattern layer 16a. The fourth pattern layer 16a may have a thickness (e.g., length in the Z-axis direction) that is greater than a thickness (e.g., length in the Z-axis direction) of the fifth pattern layer 16b and a thickness (e.g., length in the Z-axis direction) of the sixth pattern layer 16c. In an embodiment, at least one of the fourth pattern layer 16a, the fifth pattern layer 16b, or the sixth pattern layer 16c may include a silicon layer. For example, the fourth pattern layer 16a and the sixth pattern layer 16c may include a silicon layer, and the fifth pattern layer 16b may include a different material. For example, the fifth pattern layer 16b may include a plurality of layers, sequentially stacked, for example, a silicon oxide layer, a silicon nitride layer, and a silicon oxide layer, sequentially stacked. However, embodiments of the present disclosure are not limited thereto.

In an embodiment, the first pattern structure 14 and the second pattern structure 16 may be formed by the same process. Therefore, the first and fourth pattern layers 14a and 16a may have substantially the same thickness. The first and fourth pattern layers 14a and 16a may include the same material. Likewise, the third and sixth pattern layers 14c and 16c may have substantially the same thickness. The third and sixth pattern layers 14c and 16c may include the same material. The second and fifth pattern layers 14b and 16b may have substantially the same thickness. The second pattern layer 14b may include a material that different from the material of the fifth pattern layer 16b. In an embodiment, the second pattern layer 14b may be a layer in which a sacrificial insulating layer formed by the same process as the fifth pattern layer 16b is replaced with a conductive material.

The first pattern structure 14 may further include a seventh pattern layer 14d. The seventh pattern layer 14d may be disposed on the same level as a level of the second pattern layer 14b, and may be spaced apart from the second pattern layer 14b on the first pattern layer 14a. The third pattern layer 14c may cover the second pattern layer 14b and the seventh pattern layer 14d on the first pattern layer 14a. The second pattern layer 14b and the seventh pattern layer 14d may have substantially the same thickness. The seventh pattern layer 14d may include a material, different from that of the silicon layer. For example, the seventh pattern layer 14d may include a plurality of layers, sequentially stacked, for example, a silicon oxide layer, a silicon nitride layer, and a silicon oxide layer, sequentially stacked. However, embodiments of the present disclosure are not limited thereto.

In an embodiment, the second pattern structure 16 may have a square shape in a plan view (e.g., in a plane defined in the X-axis and Y-axis directions). However, embodiments of the present disclosure are not limited thereto and the second pattern structure 16 may have various shapes in a plan view such as, for example, a rectangle, a parallelogram, a circle, or the like. In an embodiment, the second pattern structure 16 may be provided as a plurality of second pattern structures 16. The plurality of second pattern structures 16 may be arranged in a predetermined direction, for example, in a Y-axis direction, but embodiments of the present disclosure are not limited thereto, and the plurality of second pattern structures 16 may be arranged in a zigzag shape, etc. The second pattern structure 16 may be a structure for preventing dishing in a chemical-mechanical planarization (CMP) process.

The first structure 2 may further include gaps 15. In an embodiment, the gaps 15 may be slits or openings passing through a portion of the first pattern structure 14, or a space between the first pattern structure 14 and the second pattern structure 16. The first structure 2 may further include an inner insulating layer 15a filling the gaps 15 passing through the first pattern structure 14, and an outer insulating layer 15b filling a space between the first pattern structure 14 and the second pattern structure 16.

The first structure 2 may further include a ground pattern 18 disposed below the pattern structure 12. The ground pattern 18 may include a first ground pattern 18a disposed below the first pattern structure 14, and a second ground pattern 18b disposed below the second pattern structure 16. For example, the first ground pattern 18a may be disposed below the first pattern layer 14a, and may be grounded to the substrate 4 through a portion of the circuit wiring 11. The first ground pattern 18a may have a shape extending from the first pattern layer 14a through at least a portion of the lower insulating layer 13. For example, when the first pattern layer 14a is formed of a silicon layer, the first ground pattern 18a may be a silicon layer extending into the silicon layer. The second ground pattern 18b may be disposed below the fourth pattern layer 16a, and may be grounded to the substrate 4 through a portion of the circuit wiring 11. The second ground pattern 18b may have a shape extending from the fourth pattern layer 16a through at least a portion of the lower insulating layer 13.

The second structure 52 may include a stack structure 55 on the first structure 2, a memory vertical structure 80 passing through at least a portion of the stack structure 55, and a capacitor 90 passing through at least a portion of the stack structure 55. The second structure 52 may further include separation structures 20 passing through the stack structure 55, and a string separation pattern 30 passing through a portion of the stack structure 55.

The stack structure 55 may include a first stack structure 60 disposed on the first pattern structure 14, and a second stack structure 70 disposed on the second pattern structure 16.

The first stack structure 60 may include a first region MCA and a second region SA. In an embodiment, the first region MCA may be a memory cell region, and the second region SA may be a step region, an extension region, or a contact region. Hereinafter, for convenience of description, the first region MCA will be referred to as a memory cell region, and the second region SA will be referred to as a step region.

The first pattern layer 14a, the second pattern layer 14b, and the third pattern layer 14c may be disposed below the memory cell region MCA of the first stack structure 60. The first pattern layer 14a, the seventh pattern layer 14d, and the third pattern layer 14c may be disposed below the step region SA of the first stack structure 60. The third pattern layer 14c may directly contact the first pattern layer 14a below an interface between the memory cell region MCA and the step region SA. Therefore, the second pattern layer 14b and the seventh pattern layer 14d may be arranged to be spaced apart from each other (e.g., in the X-axis direction).

The first stack structure 60 may include gate electrodes 64 and interlayer insulating layers 66, alternately stacked (e.g., in the Z-axis direction). The gate electrodes 64 may be stacked while being spaced apart from each other in the Z-axis direction in the memory cell region MCA, and may be arranged in a step shape as they extend with different lengths in the X-axis direction in the step region SA.

Each of the gate electrodes 64 may include a gate pad GP disposed thereon in the step region SA. The gate pad GP may have a thickness that is greater than a thickness of each of the gate electrodes located in the memory cell region MCA. Therefore, the gate pad GP may have a step shape. However, embodiments of the present disclosure are not limited thereto and a shape of the gate pad GP may be arranged in various shapes.

In embodiments, the 'gate pad' GP may be defined as a region of the gate electrode of which the upper portion is not covered by another adjacent gate electrode in the step region SA.

The gate electrodes 64 may include a conductive material. For example, each of the gate electrodes 64 may include any one material or two or more materials of a doped polysilicon, a metal-semiconductor compound (e.g., TiSi, TaSi, CoSi, NiSi, WSi, or the like), a metal nitride (e.g., TiN, TaN, WN, or the like) or a metal (e.g., Ti, W, or the like). The interlayer insulating layers 66 may be formed of an insulating material such as silicon oxide or the like. However, embodiments of the present disclosure are not limited thereto.

The second stack structure 70 may include first insulating layers 74 and second insulating layers 76, alternately and repeatedly stacked. The first insulating layers 74 may be spaced apart from the gate electrodes 64, and disposed on the same level as the gate electrodes 64. The second insulating layers 76 may be spaced apart from the interlayer insulating layers 66, and disposed on the same level as the interlayer insulating layers 66. In an embodiment, the interlayer insulating layers 66 and the second insulating layers 76 may include the same material. The interlayer insulating layers 66 and the second insulating layers 76 may include, for example, silicon oxide. The first insulating layers 74 may include an insulating material that is different from that of the second insulating layers. In an embodiment, the first insulating layers 74 may be formed of, for example, silicon nitride. However, embodiments of the present disclosure are not limited thereto.

The memory vertical structure 80 may include a portion passing through the first stack structure 60 in the memory cell region MCA. The memory vertical structure 80 may extend into the first pattern structure 14 from a portion passing through the first stack structure 60, to contact the first pattern structure 14. For example, in an embodiment, the memory vertical structure 80 may sequentially pass through the third pattern layer 14c and the second pattern layer 14b, and may extend into the first pattern layer 14a. The memory vertical structure 80 may directly contact at least one of the first to third pattern layers 14a, 14b, or 14c of the first pattern structure 14 that may be formed of a silicon layer.

The capacitor 90 may include a first capacitor electrode 91 and a second capacitor electrode 96, passing through the second stack structure 70 in the Z-axis direction and may extend parallel to each other. The first and second capacitor electrodes 91 and 96 may pass through the second stack structure 70, and may directly contact the second pattern structure 16. In an embodiment, each of the first and second capacitor electrodes 91 and 96 may have a shape of which a width (e.g., length in the X-axis direction) decreases in a direction towards the second pattern structure 16.

The first capacitor electrode 91 may have a linear shape extending in a direction, perpendicular to the Z-axis direction, for example, in the Y-axis direction. The second capacitor electrode 96 may have a linear shape that is spaced apart from the first capacitor electrode 91 in the X-axis direction and extending in the Y-axis direction. In an embodiment, each of the first and second capacitor electrodes 91 and 96 may have a width in a range of about 100 nm to 200 nm, and may extend in a linear shape. A length by which the first capacitor electrode 91 extends in a linear shape may be substantially the same as a length by which the second capacitor electrode 96 extends in a linear shape. However, embodiments of the present inventive concept are not limited thereto.

In an embodiment, a distance between the first capacitor electrode 91 and the second capacitor electrode 96 may be in a range of about 100 nm to about 500 nm.

Referring to FIG. 1, the first and second capacitor electrodes 91 and 96 may have a linear shape extending in the Y-axis direction, which may be a direction, perpendicular to the separation structures 20. However, embodiments of the present disclosure are not limited thereto and the first and second capacitor electrodes 91 and 96 may have a linear shape parallel to or a linear shape extending oblique to the separation structures 20.

Each of the first and second capacitor electrodes 91 and 96 may extend into the second pattern structure 16 from a portion passing through the second stack structure 70, to directly contact the second pattern structure 16. For example, in an embodiment, each of the first and second capacitor electrodes 91 and 96 may pass through the sixth pattern layer 16c, and may directly contact an upper surface of the fourth pattern layer 16a. The fifth pattern layer 16b may be disposed to be spaced apart from the first and second capacitor electrodes 91 and 96. The sixth pattern layer 16c may extend into a space in which the fifth pattern layer 16b and the first and second capacitor electrodes 91 and 96 are spaced apart, to directly contact the fourth pattern layer 16a. Therefore, a portion of the sixth pattern layer 16c may directly contact the upper surface of the fourth pattern layer 16a.

Upper surfaces of the first and second capacitor electrodes 91 and 96 may be disposed on a higher level (e.g., distance from an upper surface of the substrate 4 in the Z-axis direction) than a level of an upper surface of the memory vertical structure 80.

The first and second capacitor electrodes 91 and 96 may include a conductive layer. The conductive layer of each of the first and second capacitor electrodes 91 and 96 may include a conductive material, for example, any one material or two or more materials of a doped polysilicon, a metal-semiconductor compound (e.g., TiSi, TaSi, CoSi, NiSi, WSi, or the like), a metal nitride (e.g., TiN, TaN, WN, or the like) or a metal (e.g., Ti, W, or the like). However, embodiments of the present disclosure are not limited thereto.

The capacitor 90 may include a dielectric disposed between the first capacitor electrode 91 and the second capacitor electrode 96. The dielectric may include a portion of the second stack structure 70 disposed between the first capacitor electrode 91 and the second capacitor electrode 96 (e.g., in the X-axis direction).

Referring to FIGS. 1 and 2B, the separation structures 20 may extend in a direction, perpendicular to the Z-axis direction, for example, in the X-axis direction while passing through the first stack structure 60 in the Z-axis direction. The gate electrodes 64 between the separation structures 20 may form a memory block, but a scope of the memory block is not limited thereto. The memory vertical structure 80 may be disposed between the separation structures 20.

In an embodiment, each of the separation structures 20 may include silicon oxide or silicon oxide having a void formed therein. Each of the separation structures 20 may extend in a direction, perpendicular to the Z-axis direction, for example, in the X-axis direction, to have a linear shape. The separation structures 20 may be disposed to be spaced apart from each other (e.g., in the Y-axis direction) while extending in the linear shape. In another example, each of the separation structures 20 may include a conductive pattern contacting the first pattern structure 14 and an insulating layer covering a side surface of the conductive pattern.

Each of the separation structures 20 may extend into the first pattern structure 14, and may directly contact the first pattern structure 14. Each of the separation structures 20 may pass through the third pattern layer 14c, and may directly contact the first pattern layer 14a. Each of the separation structures 20 may be disposed to be spaced apart from the second pattern layer 14b. For example, the third pattern layer 14c may extend into a space in which the separation structures 20 and the second pattern layer 14b are spaced apart from each other, to contact the first pattern layer 14a.

The string separation pattern 30 may pass through at least a portion of the first stack structure 60. For example, in an embodiment, each of the string separation patterns 30 may pass through one or a plurality of upper gate electrodes, located in an upper portion, among the gate electrodes 64. However, embodiments of the present disclosure are not limited thereto.

Each of the string separation patterns 30 may extend between the separation structures 20 in a direction, parallel to the separation structures 20 (e.g., the X-axis direction). Each of the string separation patterns 30 may intermittently extend. The string separation pattern 30 may include silicon oxide. The string separation pattern 30 may be disposed on a higher level than that of gate electrodes, that may be word lines, among the gate electrodes 64.

In the semiconductor device 100 according to an embodiment, the second structure 52 may further include an intermediate insulating layer 53 covering the first stack structure 60 and the second stack structure 70 on the pattern structure 12 (e.g., upper surfaces of the first stack structure 60). The intermediate insulating layer 53 may cover the stack structure 55. The intermediate insulating layer 53 may include an insulating material such as silicon oxide or the like.

In the semiconductor device 100 according to an embodiment, the second structure 52 may further include upper insulating layers 54 disposed on the intermediate insulating layer 53. The upper insulating layers 54 may include an insulating material such as silicon oxide or the like. The upper insulating layers 54 may include a first upper insulating layer 54a, a second upper insulating layer 54b, and a third upper insulating layer 54c, sequentially disposed on the intermediate insulating layer 53 (e.g., in the Z-axis direction).

Referring to FIGS. 2A and 2B, the memory vertical structure 80 may pass through the intermediate insulating layer 53, and may have an upper surface, coplanar with an upper surface of the intermediate insulating layer 53 (e.g., in the Z-axis direction). In an embodiment, the first and second capacitor electrodes 91 and 96 may pass through the intermediate insulating layer 53 and the first upper insulating layer 54a, and may have upper surfaces, coplanar with an upper surface of the first upper insulating layer 54a (e.g., in the Z-axis direction). Therefore, a height of each of the upper surfaces of the first and second capacitor electrodes 91 and 96 may be higher than a height of the upper surface of the memory vertical structure 80. In an embodiment, the separation structures 20 may pass through the intermediate insulating layer 53, the first upper insulating layer 54a, and the second upper insulating layer 54b, and may have upper surfaces having the same height as the upper surface of the second upper insulating layer 54b.

The semiconductor device 100 according to an embodiment may further include a dummy vertical structure 80' passing through the first stack structure 60 while passing through the string separation pattern 30, and directly contacting the first pattern structure 14. In an embodiment, the dummy vertical structure 80' may have the same cross-sectional structure and may include the same material, as the memory vertical structure 80.

The semiconductor device 100 according to an embodiment may further include a gate contact plug 81 directly contacting the gate electrodes 64 and electrically connected to the gate pads GP. The gate contact plug 81 may pass through a portion of the second upper insulating layer 54 b, a portion of the first upper insulating layer 54 a, and a portion of the intermediate insulating layer 53, and may extend into the second structure 52 to directly contact the gate pads GP. The gate contact plug 81 may be disposed in the step region SA.

The semiconductor device 100 according to an embodiment may further include a support vertical structure 81' passing through a portion of the second structure 52 and extending into the second structure 52, in a region adjacent to the gate contact plug 81. In a plan view (e.g., in a plane defined in the X-axis and Y-axis directions), the support vertical structure 81' may have a circular shape or an oval shape.

The semiconductor device 100 according to an embodiment may further include a peripheral contact plug 82 passing through the intermediate insulating layer 53, the first upper insulating layer 54a, and the second upper insulating layer 54b. The peripheral contact plug 82 may be disposed on the first pattern structure 14 to be spaced apart from the first stack structure 60. The peripheral contact plug 82 may extend into the first pattern structure 14, and may directly contact the first pattern structure 14. The peripheral contact plug 82 may directly contact the first pattern layer 14a of the first pattern structure 14 to be electrically connected to the first pattern layer 14a. In an embodiment, in the pattern structure 12, the first pattern layer 14a may be a common source including a polysilicon layer having N-type conductivity, and the peripheral contact plug 82 may be a common source contact plug electrically connected to the common source.

The semiconductor device 100 according to an embodiment may further include at least one through-region TA passing through the first stack structure 60 and the intermediate insulating layer 53 (e.g., in the Z-axis direction) between the separation structures 20. The through-region TA may overlap the step region SA of the first stack structure 60. The through-region TA may be disposed to be spaced apart from the string separation pattern 30 (e.g., in the X-axis direction).

The through-region TA may further include horizontal insulating layers 65 located on the same level as a gate electrode 64, adjacent to the through-region TA, among the gate electrodes 64. Therefore, the horizontal insulating layers 65 may be alternately stacked with the interlayer insulating layers 66 (e.g., in the Z-axis direction). In an example embodiment, each of the through-regions TA may further include a reinforcing horizontal layer 69 contacting a horizontal insulating layer, located at an uppermost portion, among the horizontal insulating layers 65. The reinforcing horizontal layer 69 may be formed of a second silicon nitride having a different etch rate from a first silicon nitride of the horizontal insulating layers 65. The second silicon nitride may be a material having an etch rate that is faster than an etch rate of the first silicon nitride.

When viewed in a plan view, as in FIG. 1, in the first stack structure 60, the through-region IA may be surrounded by a gate region GA of FIG. 1. In this embodiment, the gate region GA may be a region in which the gate electrodes 64 are disposed. Therefore, the through-region TA may be surrounded by adjacent gate electrodes 64.

The semiconductor device 100 according to an embodiment may further include a through-contact plug 83 passing through the through-region TA. The through-contact plug 83 may electrically connect the gate electrodes 64 and the peripheral circuit 8. The through-contact plug 83 may pass through the horizontal insulating layers 65 and the inner insulating layer 15a, and may extend to the lower insulating layer 13 to contact the circuit wiring 11. An upper surface of the through-contact plug 83 may be coplanar with an upper surface of the peripheral contact plug 82 (e.g., in the Z-axis direction).

The semiconductor device 100 according to an embodiment may further include a dam structure 89 surrounding the through-region TA. The dam structure 89 may surround the through-region TA while passing through the first stack structure 60. In plan view, the dam structure 89 may be disposed between the through-region TA and the gate region GA.

The dam structure 89 may extend into the first pattern structure 14 from a portion passing through the first stack structure 60, to directly contact the first pattern structure 14. For example, the dam structure 89 may pass through the third pattern layer 14c, and may directly contact an upper surface of the first pattern layer 14a. The seventh pattern layer 14d may be disposed to be spaced apart from the dam structure 89. The third pattern layer 14c may extend into a space in which the seventh pattern layer 14d and the dam structure 89 are spaced apart from each other, to directly contact the first pattern layer 14a. Therefore, a portion of the third pattern layer 14c may directly contact the upper surface of the first pattern layer 14a.

The dam structure 89 may include the same material as the first capacitor electrode 91 and the second capacitor electrode 96. For example, the dam structure 89 may include a conductive material.

In an embodiment, the dam structure 89 may pass through the first upper insulating layer 54a and the intermediate insulating layer 53. The dam structure 89 may have an upper surface coplanar with the upper surfaces of the first and second capacitor electrodes 91 and 96 (e.g., in the Z-axis direction). For example, the upper surfaces of the first and second capacitor electrodes 91 and 96 may be coplanar with the upper surface of the dam structure 89 and the upper surface of the first upper insulating layer 54a (e.g., in the Z-axis direction). In an embodiment, the dam structure 89 may be formed in a trench formed in the same process operation as the first and second capacitor electrodes 91 and 96.

The semiconductor device 100 according to an embodiment may further include studs. The studs may include a bit line stud 84a directly contacting the memory vertical structure 80 on the memory vertical structure 80, a gate contact stud 84b directly contacting the gate contact plug 81 on the gate contact plug 81, a peripheral contact stud 84c directly contacting the peripheral contact plug 82 on the peripheral contact plug 82, a first capacitor stud 93 directly contacting the first capacitor electrode 91 on the first capacitor electrode 91, and a second capacitor stud 98 directly contacting the second capacitor electrode 96 on the second capacitor electrode 96. Widths of the studs may be different from widths of the memory vertical structure 80, the gate contact plug 81, the peripheral contact plug 82, the first capacitor electrode 91, and the second capacitor electrode 96, respectively. For example, in an embodiment, the widths of the bit line stud 84a, gate contact stud 84b, peripheral contact stud 84c, first capacitor stud 93 and second capacitor stud 98 may be less than the widths of the memory vertical structure 80, the gate contact plug 81, the peripheral contact plug 82, the first capacitor electrode 91, and the second capacitor electrode 96, respectively. In an embodiment, the widths of the bit line stud 84a, gate contact stud 84b, peripheral contact stud 84c, first capacitor stud 93 and second capacitor stud 98 may increase in a direction towards an upper surface of the third upper insulating layer 54c.

The bit line stud 84a may pass through the first, second, and third upper insulating layers 54a, 54b, and 54c to directly contact the memory vertical structure 80.

The gate contact stud 84b may pass through the third upper insulating layer 54c to contact the gate contact plug 81.

The peripheral contact stud 84c may pass through the third upper insulating layer 54c to directly contact the peripheral contact plug 82.

The first and second capacitor studs 93 and 98 may pass through the second and third upper insulating layers 54b and 54c, to directly contact the first and second capacitor electrodes 91 and 96, respectively.

Each of the studs may have substantially the same upper surface. For example, the upper surfaces of the studs may be coplanar (e.g., in the Z-axis direction).

The semiconductor device 100 according to an embodiment may further include wirings disposed on the third upper insulating layer 54c. The wirings may include bit lines 85a electrically connected to the bit line stud 84a, gate connection wirings 85b electrically connected to the gate contact stud 84b, peripheral wirings 85c electrically connected to the peripheral contact stud 84c, a first capacitor wiring 94 electrically connected to the first capacitor electrode 91, and a second capacitor wiring 99 electrically connected to the second capacitor electrode 96.

Next, examples of the gate electrodes 64 and the memory vertical structure 80 described above will be described with reference to FIG. 3A. FIG. 3A is an partially enlarged view of portion 'A' of FIG. 2A.

The gate electrodes 64 may include lower gate electrodes, intermediate gate electrodes, and upper gate electrodes. In an embodiment, the lower gate electrodes may be a ground select gate line or a dummy gate line of a ground select transistor. However, embodiments of the present disclosure are not limited thereto. For example, in an embodiment, at least a portion of the lower gate electrodes may be an erase control gate line of an erase control transistor that may be used in an erase operation that erases data stored in memory cells using a gate induce drain leakage (GIDL) phenomenon. In an embodiment, the intermediate gate electrodes may be word lines. In an embodiment, the upper gate electrodes may be string select gate lines of string select transistors. However, embodiments of the present disclosure are not limited thereto. For example, in an embodiment at least a portion of the upper gate electrodes may be an erase control gate line of an erase control transistor.

The first stack structure 60 may include a first lower stack structure 61 and a first upper stack structure 62 disposed on the first lower stack structure 61 (e.g., disposed directly thereon in the Z-axis direction).

The memory vertical structure 80 may include a region in which the width decreases at a constant slope in a direction towards the first pattern structure 14 while passing through the first stack structure 60. The memory vertical structure 80 may further include a slope change portion on a level between the first lower stack structure 61 and the first upper stack structure 62. For example, a side surface of the memory vertical structure 80 may include a side slope change portion in which a slope is changed on a height level between an uppermost gate electrode among gate electrodes 64 of the first lower stack structure 61 and a lowermost gate electrode among gate electrodes 64 of the first upper stack structure 62. In the memory vertical structure 80, a width on the uppermost level of the first lower stack structure 61 may be greater than a width on the lowermost level of the first upper stack structure 62. However, embodiments of the present disclosure are not limited thereto. For example, in an embodiment, the memory vertical structure 80 may not include the slope change portion or may include a plurality of slope change portions.

In an embodiment, the memory vertical structure 80 may include an insulating gap-fill layer 88, a channel layer 87 covering an outer side surface and a bottom surface of the insulating gap-fill layer 88, a data storage structure 86 covering an outer side surface and a bottom surface of the channel layer 87, and a pad material layer 85 on the insulating gap-fill layer 88.

The data storage structure 86 may include a first dielectric layer 86c covering the outer side surface and the bottom surface of the channel layer 87, an information storage material layer 86b covering an outer side surface and a bottom surface of the first dielectric layer 86c, and a second dielectric layer 86a covering an outer side surface and a bottom surface of the information storage material layer 86b. The first dielectric layer 86c may directly contact the channel layer 87, and the information storage material layer 86b may be spaced apart from the channel layer 87. In an embodiment, the insulating gap-fill layer 88 may include silicon oxide, for example, silicon oxide that may be formed by an atomic layer deposition process, or silicon oxide having a void formed therein. The first dielectric layer 86c may include silicon oxide or silicon oxide doped with impurities. The second dielectric layer 86a may include at least one of silicon oxide or a high-k dielectric. The information storage material layer 86b may include a material for trapping charges and storing information, for example, silicon nitride.

The information storage material layer 86b of the data storage structure 86 of the memory vertical structure 80 may include regions for storing information in a semiconductor device such as a flash memory device. In an embodiment, the channel layer 87 may include polysilicon. The pad material layer 85 may include at least one of doped polysilicon, metal nitride (e.g., TiN or the like), metal (e.g., W or the like), or a metal-semiconductor compound (e.g., TiSi or the like). The pad material layer 85 may be electrically connected to and in direct contact with the bit line stud 84a.

The memory vertical structure 80 may sequentially pass through the third pattern layer 14c and the second pattern layer 14b of the first pattern structure 14, and may extend into the first pattern layer 14a. In the first pattern structure 14, the second pattern layer 14b may pass through the data storage structure 86, and may directly contact the channel layer 87.

The semiconductor device 100 according to an embodiment may further include a dielectric layer 67 disposed between the side surface of the memory vertical structure 80 and the side surface of each of the gate electrodes 64 while covering the upper surface and the lower surface of each of the gate electrodes 64. In an embodiment, the dielectric layer 67 may include a high-k dielectric having a higher dielectric constant than silicon oxide. For example, the dielectric layer 67 may be formed of a high-k dielectric material such as aluminum oxide, lanthanum oxide, hafnium oxide, or the like. However, embodiments of the present disclosure are not limited thereto.

Next, an example of the dam structure 89 and the capacitor 90, described above, will be described with reference to FIG. 3B. FIG. 3B is an partially enlarged view of portions 'B' and 'C' of FIG. 2A.

The dam structure 89 may be disposed to surround the through-region TA. The dam structure 89 may include horizontal regions arranged in a straight line, parallel to the separation structures 20, extending in the X-axis direction, and vertical regions extending in the Y-axis direction, in plan view. In an embodiment, the horizontal regions and the vertical regions may form a single closed curve, and the dam structure 89 may be arranged in a slit having a rectangular ring shape or a shape similar thereto, in a plan view (e.g., in a plane defined in the X-axis and Y-axis directions). The dam structure 89 may prevent a material that forms the gate electrodes 64, from flowing into the through-region TA during a manufacturing process of the semiconductor device.

Referring to FIGS. 2A and 3B, the dam structure 89 may be located at a boundary between the gate electrodes 64 and the horizontal insulating layers 65. An outer side surface of the dam structure 89 may face the gate electrodes 64, and an inner side surface of the dam structure 89 may face the horizontal insulating layers 65. In this specification, among terms used in relation to the dam structure 89, the "outer side surface" may refer to a side surface of the dam structure 89 facing an external space or the gate region (GA, see FIG. 1), and the "inner side surface" may refer to a side surface of the dam structure 89 facing an internal space or the through-region (TA, see FIG. 1). The dam structure 89 may be located on substantially the same height level as the separation structures 20. In an embodiment, the dam structure 89 may be formed in a trench formed in the same process operation as the separation structures 20. Also, similarly to the separation structures 20, the dam structure 89 may be disposed in a region in which the third pattern layer 14c directly contacts the first pattern layer 14a. Therefore, the dam structure 89 may pass through the third pattern layer 14c on a lower end, may directly contact the third pattern layer 14c, and be spaced apart from the seventh pattern layer 14d. The upper surface of the dam structure 89 may be disposed on a higher level than a level of the upper surface of the memory vertical structure 80. The upper surface of the dam structure 89 may be coplanar with the upper surface of the first upper insulating layer 54a.

As illustrated in FIG. 3B, the dam structure 89 may include a first dam barrier layer 89b, a second dam barrier layer 89a, and a dam conductive layer 89c, sequentially stacked from inner side surfaces and a bottom surface of the slit. The first dam barrier layer 89b and the second dam barrier layer 89a may include different materials, and the dam conductive layer 89c may include a different material from the second dam barrier layer 89a. In an embodiment, the first dam barrier layer 89b and the second dam barrier layer 89a may include any one of silicon oxide, silicon nitride, or silicon oxynitride, respectively. The dam conductive layer 89c may include a conductive material, for example, at least one of doped polysilicon, metal nitride (e.g., TiN or the like), metal (e.g., W or the like), or a metal-semiconductor compound (e.g., TiSi, or the like). The first dam barrier layer 89b may extend in the Z-axis direction while covering the bottom and the side surfaces of the slit.

The first dam barrier layer 89b may cover outer side surfaces and a bottom surface of the second dam barrier layer 89a. The first dam barrier layer 89b may be adjacent to the gate electrodes 64 on an outer side surface of the dam structure 89, and may be adjacent to the horizontal insulating layers 65 on an inner side surface of the dam structure 89. A lower end of the first dam barrier layer 89b may directly contact the upper surface of the first pattern layer 14a, or may be disposed to partially recess the first pattern layer 14a.

The second dam barrier layer 89a may be disposed on the first dam barrier layer 89b, and may be disposed on, for example, opposite inner side surfaces of the first dam barrier layer 89b. The second dam barrier layer 89a may be disposed between the first dam barrier layer 89b and the dam conductive layer 89c. The second dam barrier layer 89a may cover side surfaces and a bottom surface of die dam conductive layer 89c. The second dam barrier layer 89a may cover a portion in which the first dam barrier layer 89b covers the bottom surface of the slit, and may extend along inner side surfaces of the first dam barrier layer 89b in the Z-axis direction. The second dam barrier layer 89a may directly contact the inner side surfaces of the first dam barrier layer 89b. Inner side surfaces of the second dam barrier layer 89a may directly contact the dam conductive layer 89c.

A lower surface and side surfaces of the dam conductive layer 89c may be surrounded by the second dam barrier layer

89a. The dam conductive layer 89c may have a horizontal thickness that is greater than a horizontal thickness of the first dam barrier layer 89b and a horizontal thickness of the second dam barrier layer 89a. In an embodiment, the dam conductive layer 89c may be disposed to have a rectangular ring shape or a shape similar thereto, in a plan view. In an embodiment, the dam conductive layer 89c may be disposed in a central region of the dam structure 89 between opposite inner side surfaces of the second dam barrier layer 89a. In this embodiment, the central region may be, for example, a region including a central axis between the outer side surface and the inner side surface in the dam structure 89.

The first capacitor electrode 91 may have a linear shape extending in the Y-axis direction while passing through the second stack structure 70 in the Z-axis direction, in plan view. The extending direction is not limited thereto, and for example, may be a direction, parallel to the separation structures 20, extending in the X-axis direction, or a direction extending at an acute angle of 90 degrees or less.

Referring to FIGS. 2A and 3B, the first capacitor electrode 91 may pass through the first insulating layers 74, and may be disposed to be spaced apart from the first insulating layers 74.

The semiconductor device 100 according to an example embodiment may further include a first separation insulating layer 92 including a first barrier layer 92a covering a side surface and a lower surface of the first capacitor electrode 91, and a second barrier layer 92b covering a side surface and a lower surface of the first barrier layer 92a. Therefore, the side surface of the first capacitor electrode 91 may face the first separation insulating layer 92. An inner side surface of the first separation insulating layer 92 may face the first capacitor electrode 91, and an outer side surface of the first separation insulating layer 92 may face the first insulating layers 74. The first separation insulating layer 92 may separate the first capacitor electrode 91 and the second pattern structure 16. The first barrier layer 92a and the second barrier layer 92b may include different materials. In an embodiment, the first barrier layer 92a and the second barrier layer 92b may include any one of silicon oxide, silicon nitride, or silicon oxynitride, respectively. For example, in an embodiment, the first barrier layer 92a may be silicon nitride, and the second barrier layer 92b may be silicon oxide. The first capacitor electrode 91 may include a conductive material, for example, at least one of doped polysilicon, metal nitride (e.g., TiN or the like), metal (e.g., W or the like), or a metal-semiconductor compound (e.g., TiSi, or the like). An upper surface of the first capacitor electrode 91 may be coplanar with the upper surface of the dam structure 89 (e.g., in the Z-axis direction). For example, the first capacitor electrode 91 may be located on substantially the same height level as the dam structure 89. In an embodiment, the capacitor electrode 91 may be formed in a trench formed in the same process operation as the dam structure 89. Also, similarly to the dam structure 89, the first capacitor electrode 91 may be disposed in a region in which the sixth pattern layer 16c directly contacts the fourth pattern layer 16a. Therefore, the first capacitor electrode 91 may pass through the sixth pattern layer 16c on a lower end, may directly contact the fourth pattern layer 16a, and be spaced apart from the fifth pattern layer 16b. The upper surface of the first capacitor electrode 91 may be disposed on a higher level than that of the upper surface of the memory vertical structure 80. The upper surface of the first capacitor electrode 91 may be coplanar with the upper surface of the first upper insulating layer 54a (e.g., in a Z-axis direction).

The second capacitor electrode 96 (refer to FIG. 2A) may have a structure similar thereto. In the semiconductor device 100 according to an embodiment, the capacitor 90 may further include a second separation insulating layer 97 including a third barrier layer 97a (refer to FIG. 4) covering a side surface and a lower surface of the second capacitor electrode 96, and a fourth barrier layer 97b covering a side surface and a lower surface of the third barrier layer 97a. Therefore, the side surface of the second capacitor electrode 96 may face the second separation insulating layer 97. An inner side surface of the second separation insulating layer 97 may face the second capacitor electrode 96, and an outer side surface of the second separation insulating layer 97 may face the first insulating layers 74. The second separation insulating layer 97 may separate the second capacitor electrode 96 and the second pattern structure 16. The third barrier layer 97a and the fourth barrier layer 97b may include different materials. The third barrier layer 97a and the fourth barrier layer 97b may include any one of silicon oxide, silicon nitride, or silicon oxynitride, respectively. For example, the third barrier layer 97a may be silicon nitride, and the fourth barrier layer 97b may be silicon oxide. The second capacitor electrode 96 may include a conductive material, for example, at least one of doped polysilicon, metal nitride (e.g., TiN or the like), metal (e.g., W or the like), or a metal-semiconductor compound (e.g., TiSi, or the like). Similar to the dam structure 89, the second capacitor electrode 96 may be disposed in a region in which the sixth pattern layer 16c directly contacts the fourth pattern layer 16a. Therefore, the second capacitor electrode 96 may pass through the sixth pattern layer 16c on a lower end, may directly contact the fourth pattern layer 16a, and be spaced apart from the fifth pattern layer 16b. The upper surface of the second capacitor electrode 96 may be disposed on a higher level than a level of the upper surface of the memory vertical structure 80. The upper surface of the second capacitor electrode 96 may be coplanar with the upper surface of the first upper insulating layer 54a (e.g., in the Z-axis direction).

A dielectric of the capacitor 90 disposed between the first capacitor electrode 91 and the second capacitor electrode 96 may include a portion of the second stack structure 70 disposed between the first capacitor electrode 91 and the second capacitor electrode 96, a portion of the first separation insulating layer 92 covering a side surface of the first capacitor electrode 91 facing the second capacitor electrode 96, and a portion of the second separation insulating layer 97 covering a side surface of the second capacitor electrode 96 facing the first capacitor electrode 91. In addition, the dielectric may include the fifth pattern layer 16b and the sixth pattern layer 16c disposed between the first capacitor electrode 91 and the second capacitor electrode 96.

Figure 4:
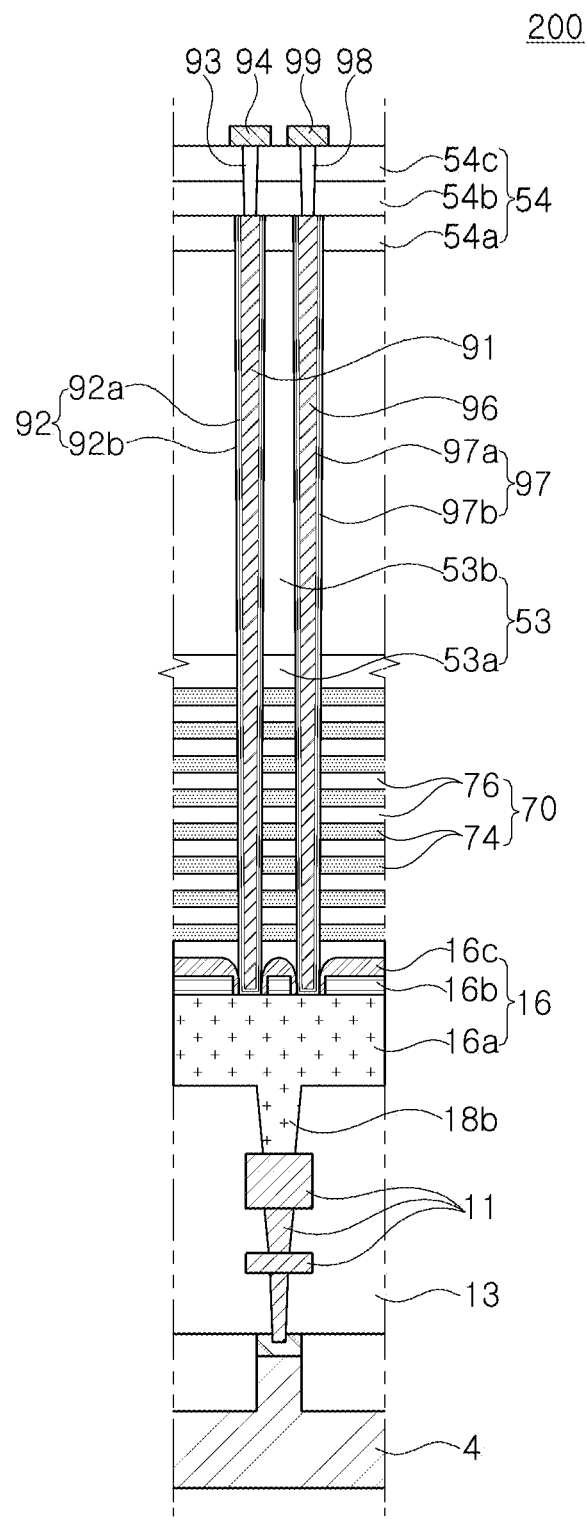
FIG. 4 is a cross-sectional view illustrating a semiconductor device according to an embodiment of the present disclosure.

FIG. 4 is a schematic cross-sectional view illustrating a semiconductor device 200 according to an example embodiment.

Referring to FIG. 4, a second stack structure 70 may include a stack structure, different from that of FIG. 1. A first stack structure 60 may include a first lower stack structure 61 and a first upper stack structure 62. The second stack structure 70 may include second insulating layers 76 disposed on the same level as interlayer insulating layers 66 of the first lower stack structure 61, and first insulating layers 74 disposed on the same level as gate electrodes 64 of the first lower stack structure 61. The second insulating layers 76 and the first insulating layers 74 may be alternately stacked (e.g., in the Z-axis direction). The first insulating layers 74 may include an insulating material that is different from the material of the second insulating layers 76. The second stack structure 70 may be covered by an intermediate insulating layer 53. For example, unlike the embodiment shown in FIG. 1, the second stack structure 70 may only be disposed on a level corresponding to the first lower stack structure 61.

The intermediate insulating layer 53 may include a first intermediate insulating layer 53*a* and a second intermediate insulating layer 53*b*. The first intermediate insulating layer 53*a* may cover the second stack structure 70, and the second intermediate insulating layer 53*b* may be disposed on the first intermediate insulating layer 53*a*.

A first capacitor electrode 91 and a second capacitor electrode 96 may pass through the intermediate insulating layer 53 and the second stack structure 70 to contact a second pattern structure 16, such as an upper surface of the fourth pattern layer 16*a*.

Figure 5:
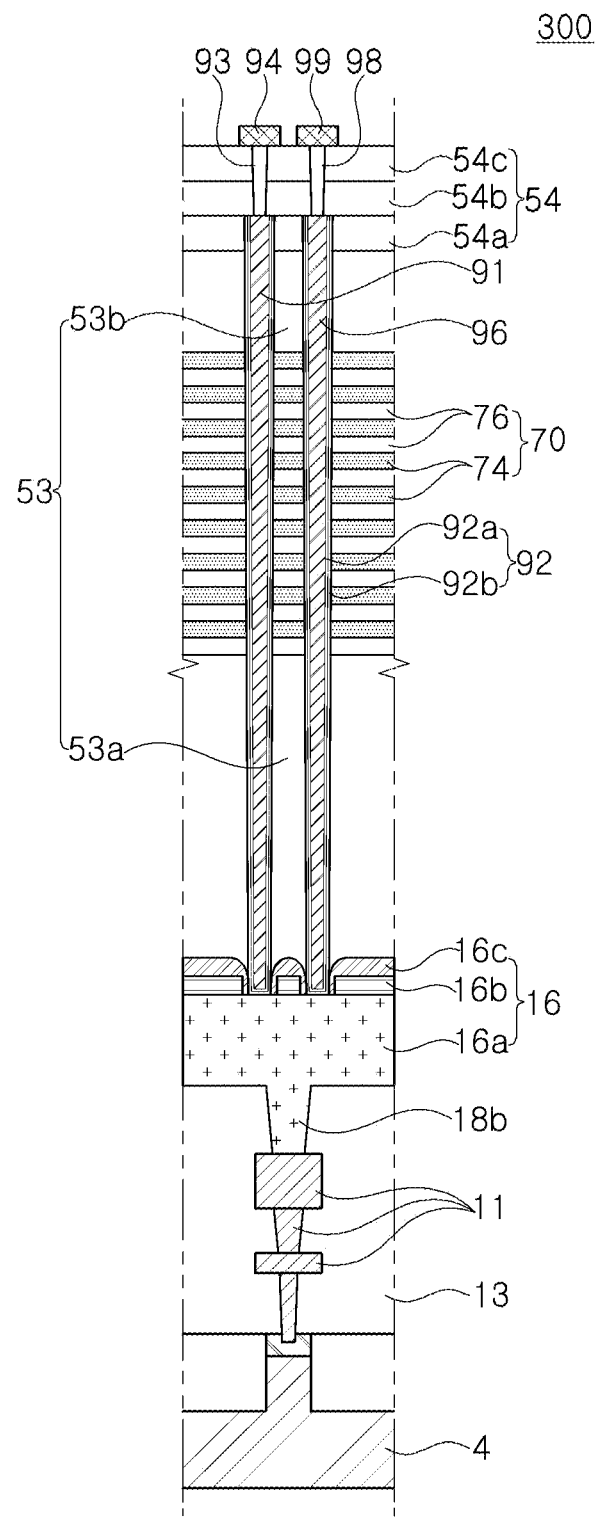
FIG. 5 is a cross-sectional view illustrating a semiconductor device according to an embodiment of the present disclosure.

FIG. 5 is a schematic cross-sectional view illustrating a semiconductor device 300 according to an example embodiment.

Referring to FIG. 5, a second stack structure 70 may include a stack structure, different from the embodiment shown in FIG. 1. A first stack structure 60 may include a first lower stack structure 61 and a first upper stack structure 62. The second stack structure 70 may include second insulating layers 76 disposed on the same level as interlayer insulating layers 66 of the first upper stack structure 62, and first insulating layers 74 disposed on the same level as gate electrodes 64 of the first upper stack structure 62. The second insulating layers 76 and the first insulating layers 74 may be alternately stacked (e.g., in the Z-axis direction). The first insulating layers 74 may include an insulating material that is different from the material of the second insulating layers 76. The second stack structure 70 may be covered by an intermediate insulating layer 53. For example, unlike FIG. 1, the second stack structure 70 may be disposed only on a level corresponding to the first upper stack structure 62.

The intermediate insulating layer 53 may include a first intermediate insulating layer 53*a* and a second intermediate insulating layer 53*b*. The second stack structure 70 may be disposed on the first intermediate insulating layer 53*a*. The second intermediate insulating layer 53*b* may be disposed on the first intermediate insulating layer 53*a*, and may cover the second stack structure 70, such as an upper surface of the second stack structure 70.

A first capacitor electrode 91 and a second capacitor electrode 96 may pass through the intermediate insulating layer 53 and the second stack structure 70 to contact a second pattern structure 16, such as an upper surface of the fourth pattern layer 16*a*.

Figure 6:
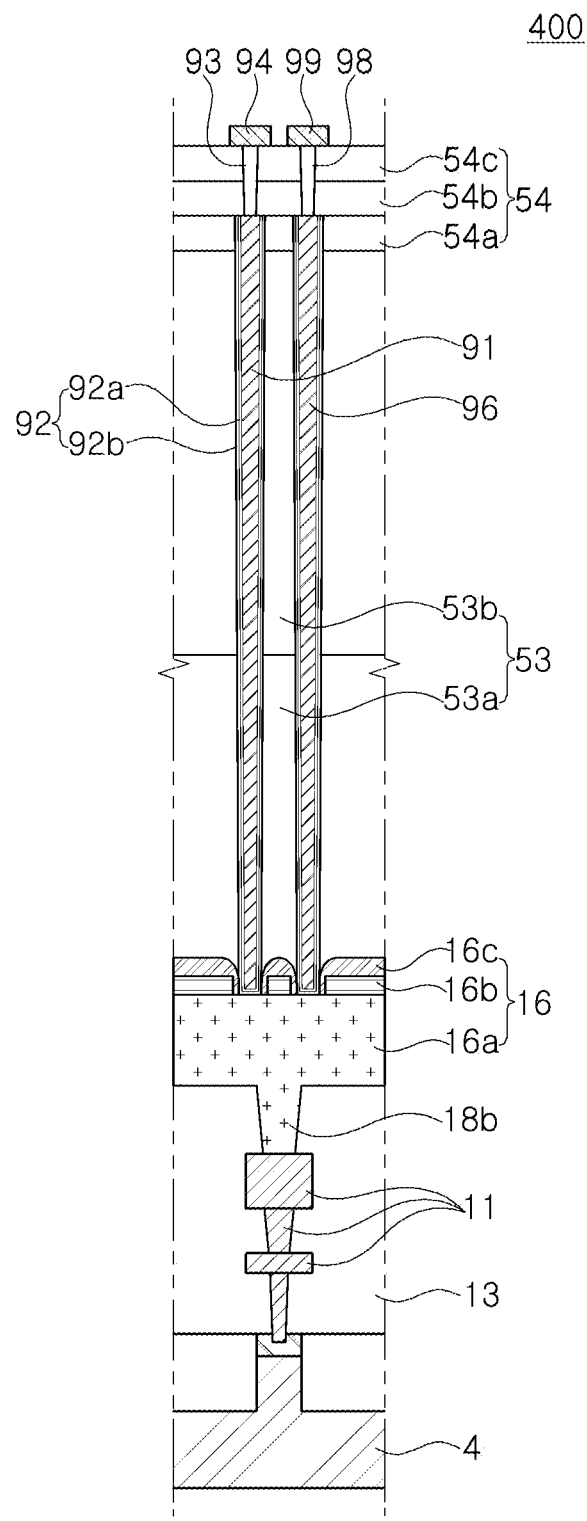
FIG. 6 is a cross-sectional view illustrating a semiconductor device according to an embodiment of the present disclosure.

FIG. 6 is a schematic cross-sectional view illustrating a semiconductor device 400 according to an example embodiment.

Referring to FIG. 6, a semiconductor device 400 according to an example embodiment may not include a second stack structure. An intermediate insulating layer 53 may be disposed on a second pattern structure 16, and a first capacitor electrode 91 and a second capacitor electrode 96 may pass through the intermediate insulating layer 53 to contact the second pattern structure 16. Therefore, there may be no separate stack structure in spaced regions of the first capacitor electrode 91 and the second capacitor electrode 96.

A semiconductor device according to an embodiment may include at least two capacitors according to the embodiments shown in FIGS. 1 to 6. For example, on a plurality of pattern structures spaced apart from a first pattern structure 14, second stack structures and capacitors according to example embodiments may be respectively disposed.

Figure 7:
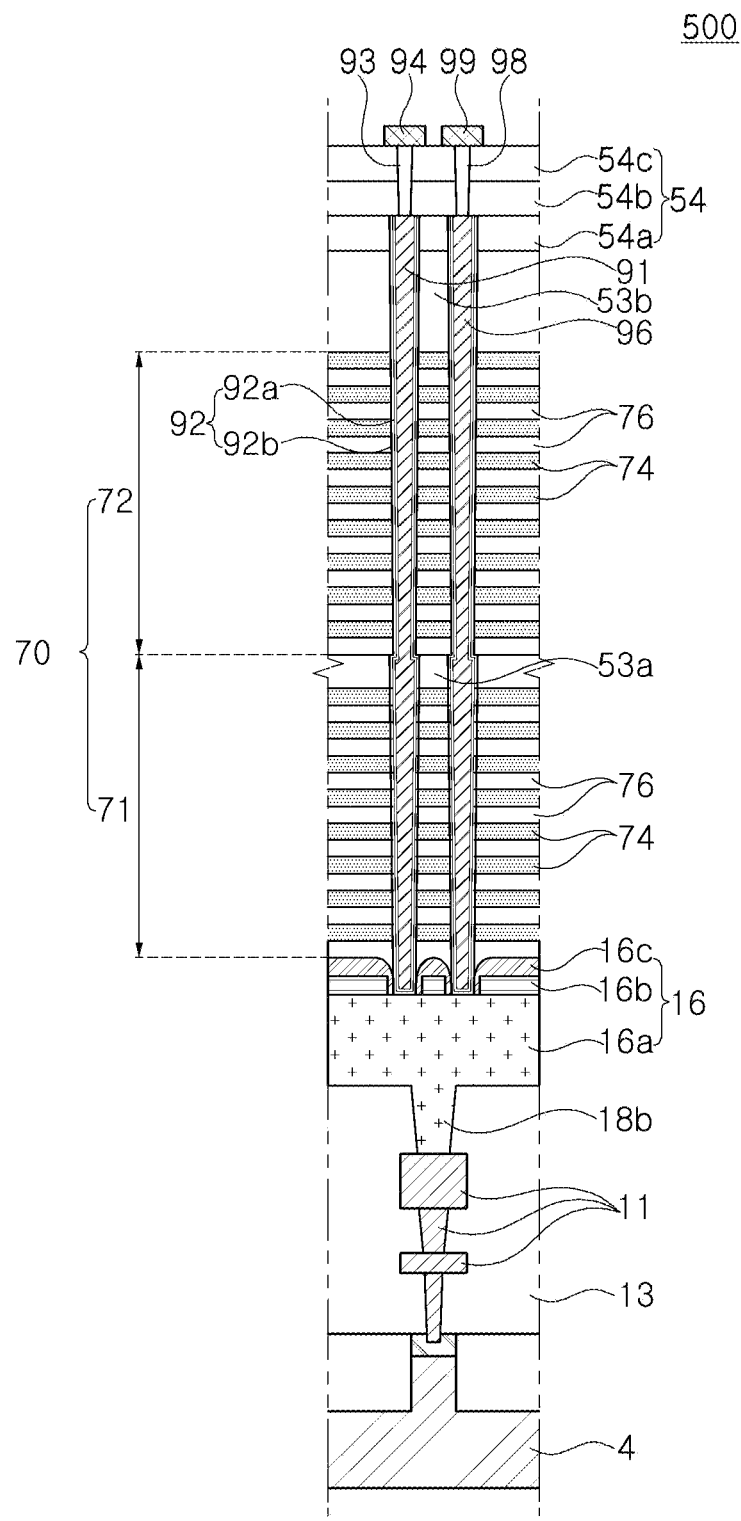
FIG. 7 is a cross-sectional view illustrating a semiconductor device according to an embodiment of the present disclosure.

FIG. 7 is a schematic cross-sectional view illustrating a semiconductor device 500 according to an example embodiment.

Referring to FIG. 7, a first capacitor electrode 91 and a second capacitor electrode 96 may have different structures from those of FIG. 1.

A second stack structure 70 may include a second lower stack structure 71 and a second upper stack structure 72 disposed on the second lower stack structure 71. The second lower stack structure 71 may have the same height as that of a first lower stack structure 61, and the second upper stack structure 72 may have the same height as that of a first upper stack structure 62.

The first capacitor electrode 91 and the second capacitor electrode 96 may include regions of which width decreases at a constant slope in a direction towards a second pattern structure 16 while passing through the second stack structure 70. The first capacitor electrode 91 and the second capacitor electrode 96 may include a slope change portion on a level between the second lower stack structure 71 and the second upper stack structure 72. For example, a side surface of each of the first and second capacitor electrodes 91 and 96 may include a side slope change portion in which a slope is changed on a height level between an uppermost first insulating layer among first insulating layers 74 of the second lower stack structure 71 and a lowermost first insulating layer among first insulating layers 74 of the second upper stack structure 72. A width of the first and second capacitor electrodes 91 and 96 on the uppermost level of the second lower stack structure 71 may be greater than a width on the lowermost level of the second upper stack structure 72.

Figure 8:
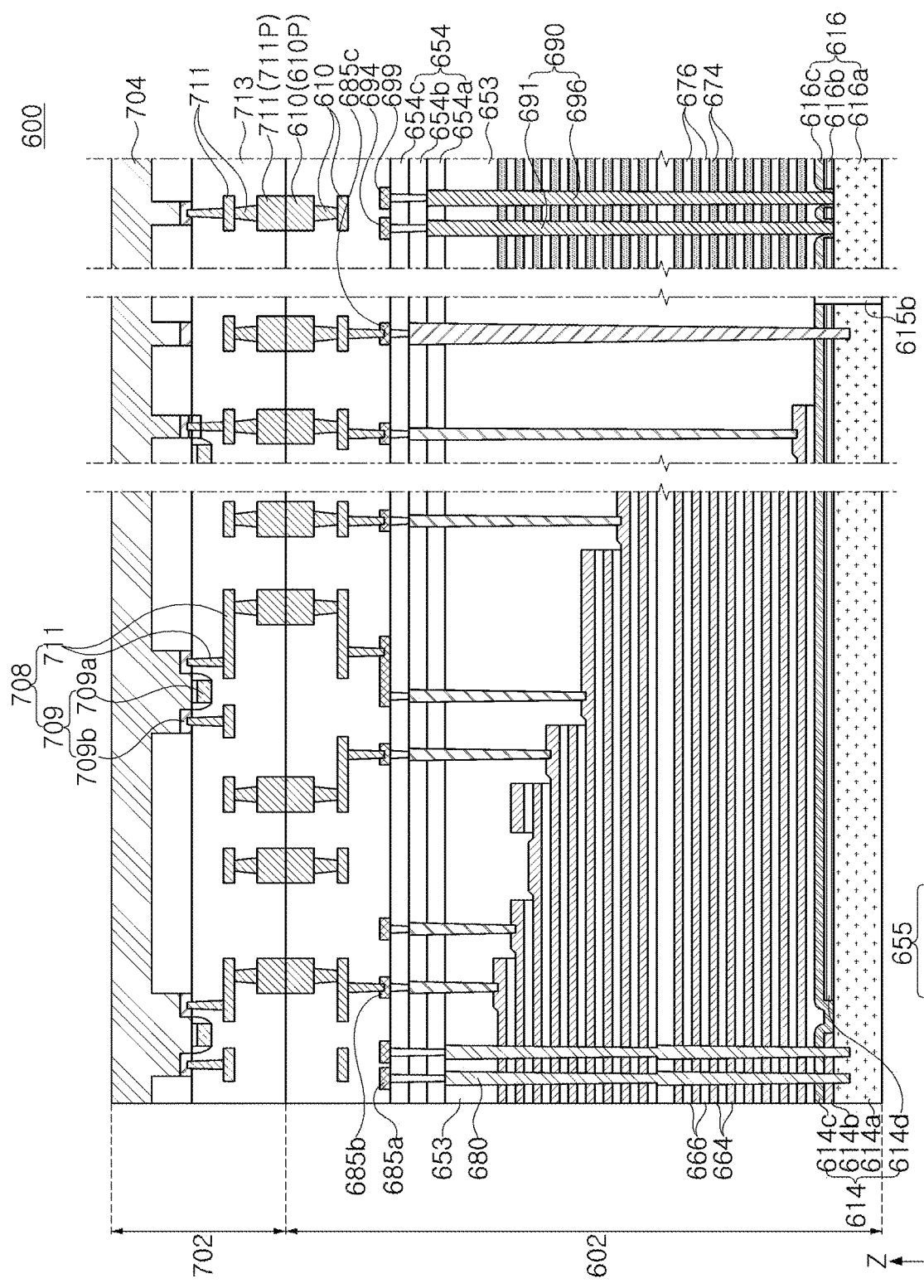
FIG. 8 is a cross-sectional view illustrating a semiconductor device according to an embodiment of the present disclosure.

FIG. 8 is a schematic cross-sectional view illustrating a semiconductor device 600 according to an example embodiment.

Referring to FIG. 8, a semiconductor device 600 according to an example embodiment may include a lower structure 602 and an upper structure 702 disposed on the lower structure 602, overlapping in a vertical direction (e.g., the Z-axis direction). The lower structure 602 may include a memory semiconductor chip, and the upper structure 702 may include a logic semiconductor chip.

The lower structure 602 may include a pattern structure 612, a stack structure 655 on the pattern structure 612, and a capacitor 690. The pattern structure 612 may include a first pattern structure 614 and a second pattern structure 616 spaced apart from the first pattern structure 614, and, referring to FIGS. 1 to 3B, may include first to seventh pattern layers 614*a* to 614*d* and 616*a* to 616*c* corresponding to the first to seventh pattern layers 14*a* to 14*d* and 16*a* to 16*c*, respectively.

The stack structure 655 may include a first stack structure 660 and a second stack structure 670 having similar structures with reference to FIGS. 1 to 3B.

The capacitor 690 may include a first capacitor electrode 691 and a second capacitor electrode 696, passing through the second stack structure 670 on the second pattern structure 616, with reference to FIGS. 1 to 3B.

The lower structure 602 may include an intermediate insulating layer 653 covering the stack structure 655 on the pattern structure 612, and upper insulating layers 654 on the intermediate insulating layer 653.

The lower structure 602 may further include wirings 685*a*, 685*b*, 685*c*, 694, and 699 that may be substantially the same as those described with reference to FIGS. 1 to 3B.

The lower structure 602 may include a lower junction wiring structure 610 electrically connected to the wirings 685a, 685b, 685c, 694, and 699 on the upper insulating layers 654. The lower junction wiring structure 610 may include lower junction pads 610p.

The upper structure 702 may include a substrate 704, and a peripheral circuit 708, including circuit element 709 disposed between the substrate 704 and the lower structure 602, and an upper junction wiring structure 711 disposed between the circuit element 709 and the lower structure 602. The upper junction wiring structure 711 may include upper junction pads 711p.

The lower junction pads 610p of the lower junction wiring structure 610 may directly contact the upper junction pads 711p of the upper junction wiring structure 711. In an embodiment, the lower junction pads 610p and the upper junction pads 711p may include a copper material. However, embodiments of the present disclosure are not limited thereto.

Figure 9:
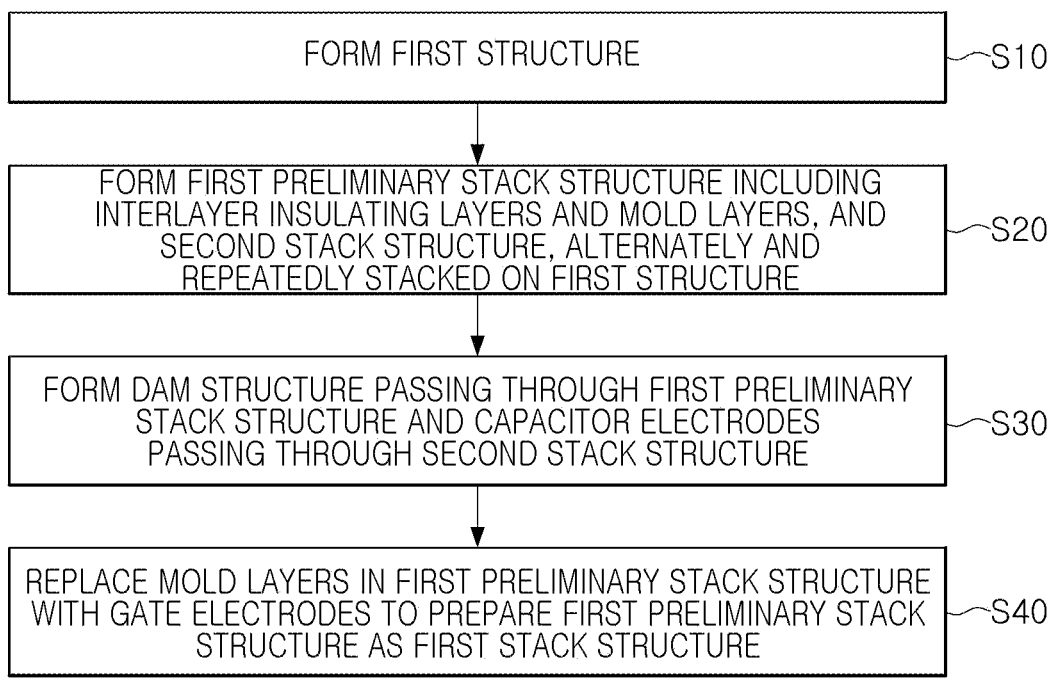
FIG. 9 is a process flow diagram illustrating a method of forming a semiconductor device according to an embodiment of the present disclosure.

FIG. 9 is a schematic process flow diagram illustrating a method of forming a semiconductor device according to an example embodiment.

Referring to FIG. 9, a first structure (2 in FIG. 2A) may be formed in block S10. The first structure 2 may be formed in the following operations. A peripheral circuit (8 in FIG. 2A) may be formed on a substrate (4 in FIG. 2A), and a lower insulating layer (13 in FIG. 2A) covering the peripheral circuit 8 may be formed. A first pattern structure (14 in FIG. 2A) and a second pattern structure (16 in FIG. 2A) may be formed on the lower insulating layer 13.

A first preliminary stack structure including interlayer insulating layers and mold layers, and a second stack structure (70 in FIG. 2A), alternately and repeatedly stacked on the first structure 2 (e.g., in the Z-axis direction), may be formed in block S20. The interlayer insulating layers and the mold layers alternately and repeatedly stacked on the first pattern structure 14 and the second pattern structure 16 may be formed, and the first preliminary stack structure disposed on the first pattern structure 14 and the second stack structure 70 disposed on the second pattern structure 16 may be formed by a photo and etching process. The interlayer insulating layers and the mold layers of the second stack structure 70 may be defined as first insulating layers (76 in FIG. 2A) and second insulating layers (74 in FIG. 2A), above described, respectively.

An intermediate insulating layer (53 in FIG. 2A) covering the first preliminary stack structure and the second stack structure 70 may be formed. A memory vertical structure 80 passing through the first preliminary stack structure and the intermediate insulating layer 53 may be formed. A first upper insulating layer (54 in FIG. 2A) covering the memory vertical structure 80 may be formed on the intermediate insulating layer 53.

A dam structure (89 in FIG. 2A) passing through the first preliminary stack structure and capacitor electrodes (91 and 96 in FIG. 2A) passing through the second stack structure 70 may be formed in block S30. Trenches passing through a first upper insulating layer 54a and the intermediate insulating layer 53 may be formed, and the trench may be filled with a barrier layer and a conductive layer, to form the dam structure 89 and the capacitor electrodes 91 and 96.

The mold layers in the first preliminary stack structure may be replaced with gate electrodes to prepare the first preliminary stack structure as a first stack structure in block S40. The barrier layer and the conductive layer may be removed from a portion of the trenches, and the mold layers in the first preliminary stack structure may be removed. The removed mold layers may be replaced with gate electrodes, and a portion of the trenches may be filled with an insulating layer, to form separation structures (20 in FIG. 2A).

Figure 10:
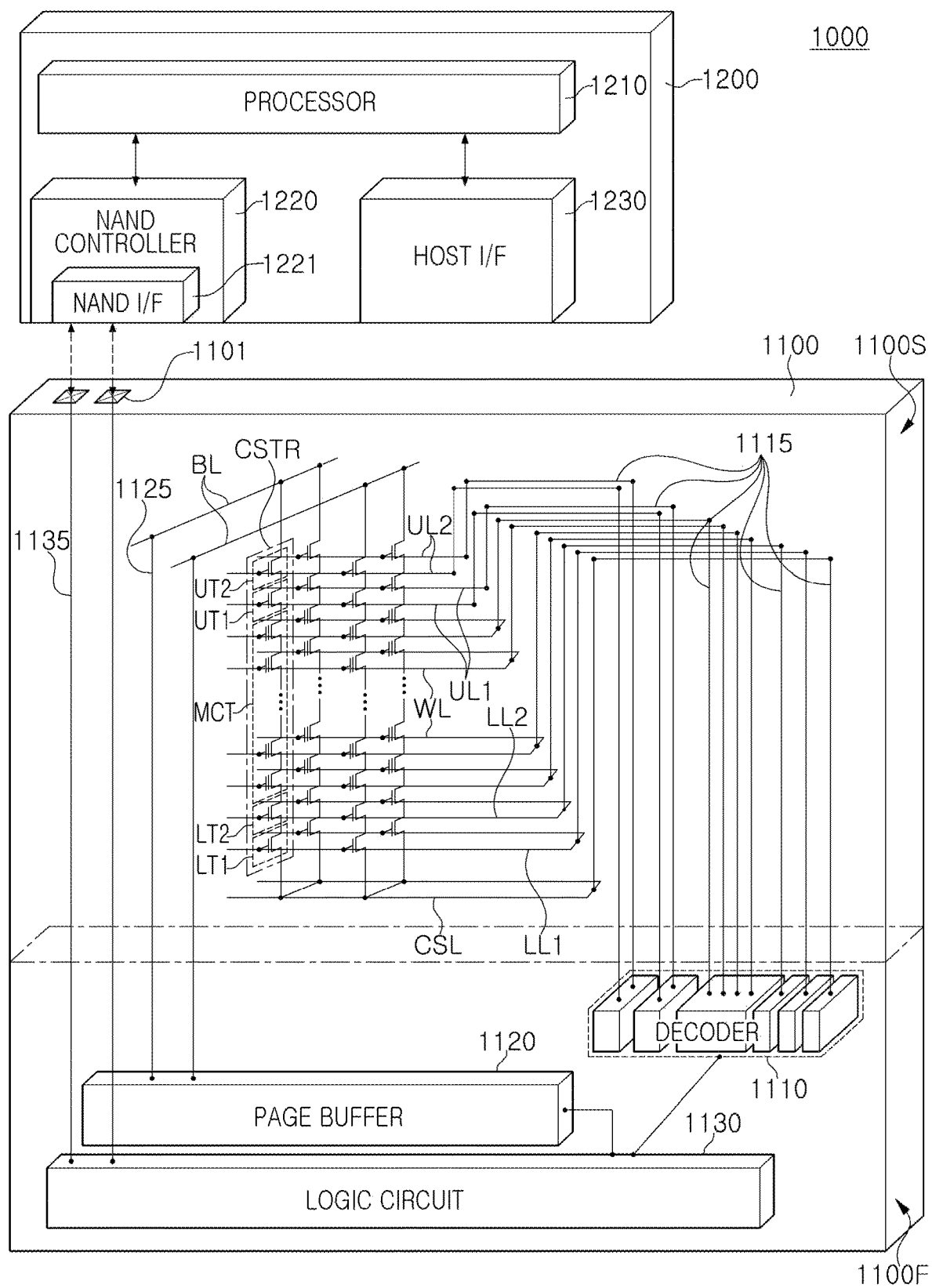
FIG. 10 is a diagram illustrating a data storage system including a semiconductor device according to an embodiment of the present disclosure.

FIG. 10 is a diagram schematically illustrating a data storage system 1000 including a semiconductor device according to an example embodiment of the present disclosure.

Referring to FIG. 10, a data storage system 1000 may include a semiconductor device 1100, and a controller 1200 electrically connected to the semiconductor device 1100 and controlling the semiconductor device 1100. In an embodiment, the data storage system 1000 may be a storage device including the semiconductor device 1100, or an electronic device including the storage device. For example, the data storage system 1000 may be a solid state drive device (SSD), a universal serial bus (USB), a computing system, a medical device, or a communication device, including the semiconductor device 1100.

In an embodiment, the data storage system 1000 may be an electronic system storing data.

The semiconductor device 1100 may be a semiconductor device according to any one of the embodiments described above with reference to FIGS. 1 to 8. The semiconductor device 1100 may include a first structure 1100F, and a second structure 1100S on the first structure 1100F.

The first structure 1100F may be a peripheral circuit structure including a decoder circuit 1110, a page buffer 1120, and a logic circuit 1130. For example, the first structure 1100F may include the peripheral circuit (8 in FIG. 2A) described above.

The second structure 1100S may be a memory cell structure including bit lines BL, a common source line CSL, word lines WL, first and second upper gate lines UL1 and UL2, first and second lower gate lines LL1 and LL2, and memory cell strings CSTR between each of the bit lines BL and the common source line CSL.

In an embodiment, the pattern structure (12 in FIG. 2A), described above, may include a silicon layer having N-type conductivity, and the silicon layer having N-type conductivity may be the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. However, embodiments of the present disclosure are not limited thereto and the number of lower transistors LT1 and LT2 and the number of upper transistors UT1 and UT2 may be variously changed.

In an embodiment, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In an embodiment, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F into the second structure 1100S.

The bit lines BL may be electrically connected to the page buffer 1120 through second connection wirings 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130.

The input/output pad 1101 may be electrically connected to the logic circuit 1130 through input/output connection wirings 1135 extending from the first structure 1100F into the second structure 1100S.

The controller 1200 may include a processor 1210, a NAND controller 1220, and a host interface 1230. According to an embodiment, the data storage system 1000 may include a plurality of semiconductor devices 1100, and the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 11:
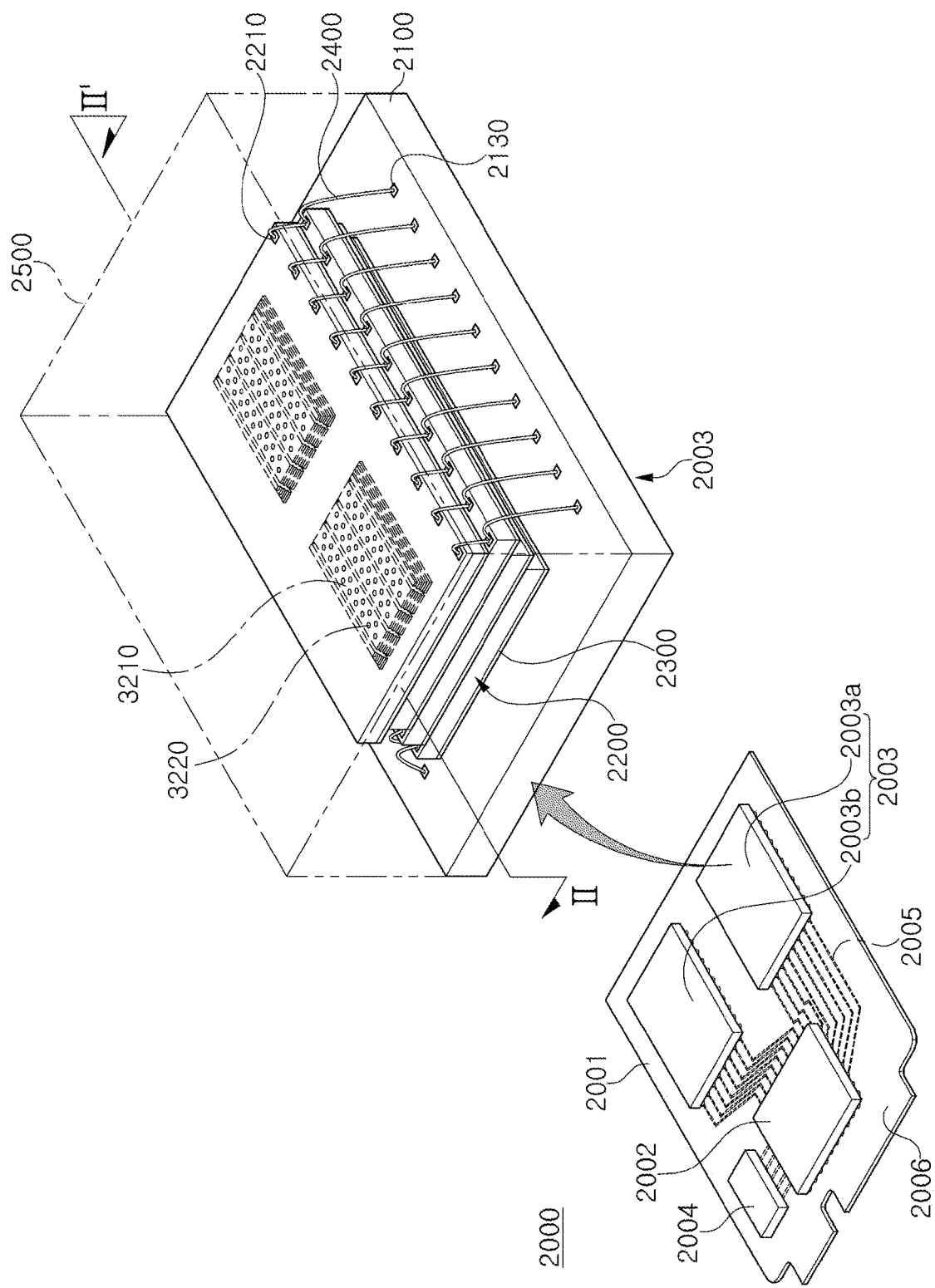
FIG. 11 is a perspective view illustrating a data storage system including a semiconductor device according to an embodiment of the present disclosure.

FIG. 11 is a perspective view schematically illustrating a data storage system 2000 including a semiconductor device according to an example embodiment.

Referring to FIG. 11, a data storage system 2000 according to an example embodiment of the present disclosure may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and an arrangement of the plurality of pins in the connector 2006 may vary according to a communication interface between the data storage system 2000 and the external host. In an embodiment, the data storage system 2000 may be communicated with the external host according to any one interface of a universal serial bus (USB), peripheral component wiring express (PCI-Express), serial advanced technology attachment (SATA), M-Phy for universal flash storage (UFS), or the like. In an embodiment, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may increase an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the semiconductor chips 2200 may include the semiconductor device according to any one of the embodiments described above with reference to FIGS. 1 to 8.

Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including upper package pads 2130. Each of the semiconductor chips 2200 may include an input/output pad 2210.

In an embodiment, the connection structure 2400 may be a bonding wire electrically connecting the input/output pad 2210 and the upper package pads 2130. Therefore, in each of the first and second semiconductor packages 2003a and 2003b, the semiconductor chips 2200 may be electrically connected to each other by a bonding wire process, and may be electrically connected to the upper package pads 2130 of the package substrate 2100. According to an embodiment, in each of the first and second semiconductor packages 2003a and 2003b, the semiconductor chips 2200 may be electrically connected to each other by a connection structure including a through silicon via (TSV), instead of a connection structure 2400 by a bonding wire process.

In an embodiment, the controller 2002 and the semiconductor chips 2200 may be included in one (1) package. In an example embodiment, the controller 2002 and the semiconductor chips 2200 may be mounted on a separate interposer substrate that is different from the main substrate 2001, and the controller 2002 and the semiconductor chips 2200 may be connected to each other by a wiring formed on the interposer substrate.

Figure 12:
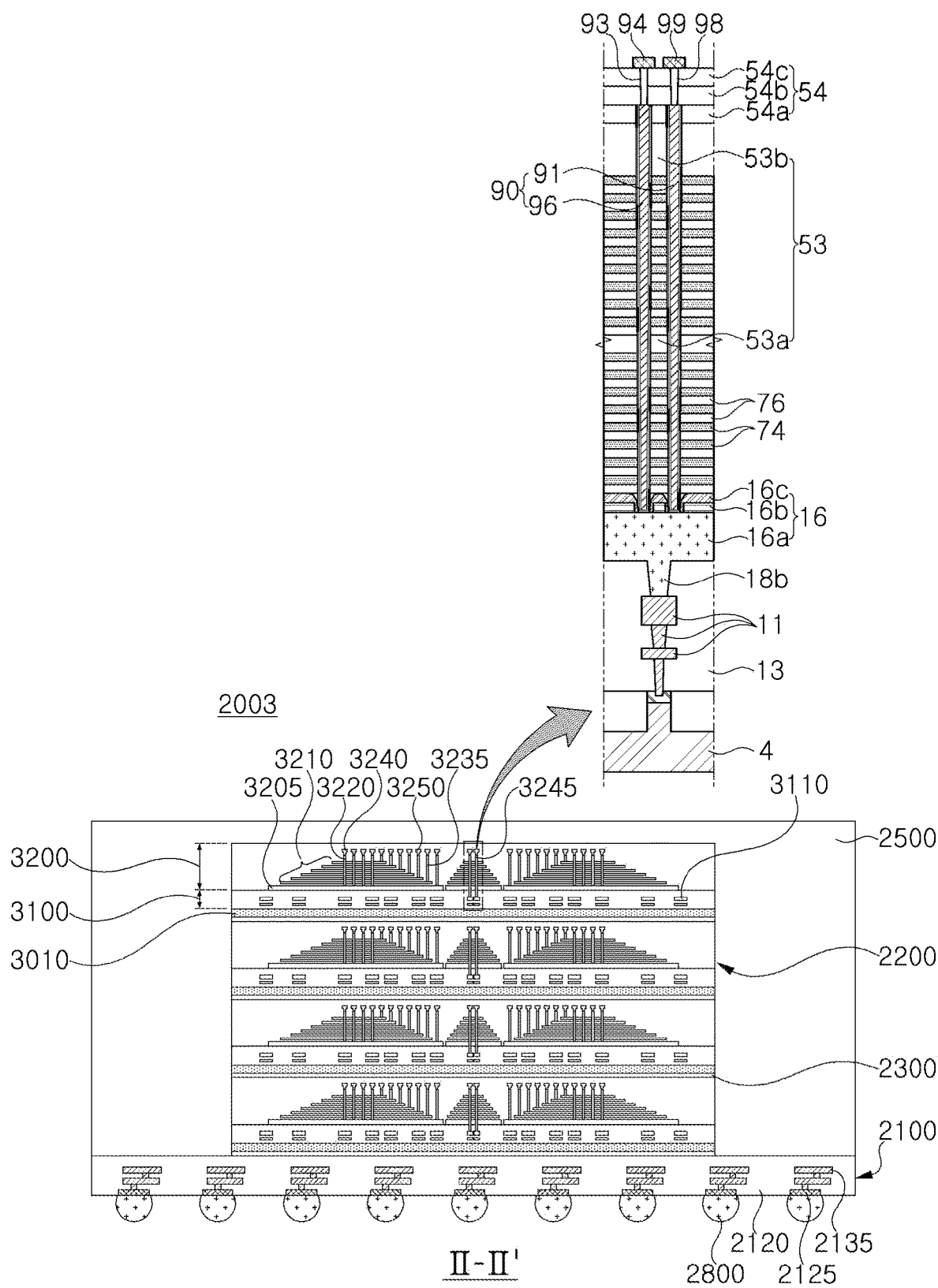
FIG. 12 is a cross-sectional view illustrating a semiconductor package taken along line II-II' of FIG. 11 according to an embodiment of the present disclosure.

FIG. 12 is a cross-sectional view schematically illustrating a semiconductor package according to an example embodiment. FIG. 12 illustrates an example embodiment of the semiconductor package 2003 of FIG. 11, and conceptually illustrates a region taken along line II-II' of the semiconductor package 2003 of FIG. 11.

Referring to FIG. 12, in the semiconductor package 2003, the package substrate 2100 may be a printed circuit board. The package substrate 2100 may include a package substrate body portion 2120, upper package pads 2130 disposed on an upper surface of the package substrate body portion 2120 (see FIG. 11), lower pads 2125 disposed on a lower surface of the package substrate body portion 2120 or exposed from the lower surface, and internal wirings 2135 electrically connecting the upper package pads 2130 and the lower pads 2125 in the package substrate body portion 2120. The upper package pads 2130 may be electrically connected to the connection structures 2400. The lower pads 2125 may be connected to the wiring patterns 2005 of the main substrate 2001 of the data storage system 2000, as illustrated in FIG. 11, through conductive connection portions 2800.

Each of the semiconductor chips 2200 may include a semiconductor substrate 3010, and a first semiconductor structure 3100 and a second semiconductor structure 3200, sequentially stacked on the semiconductor substrate 3010 (e.g., in the Z-axis direction). The first semiconductor structure 3100 may include a peripheral circuit region including peripheral wirings 3110. The second semiconductor structure 3200 may include a common source line 3205, a gate stack structure 3210 on the common source line 3205, channel structures 3220 and separation regions 3230, passing through the gate stack structure 3210, bit lines 3240 electrically connected to the channel structures 3220, and gate contact plugs 3235 electrically connected to word lines WL (refer to FIG. 10) of the gate stack structure 3210.

As described above with reference to FIGS. 1 to 3B, in each of the semiconductor chips 2200, a capacitor 90 may include a first capacitor electrode 91 passing through a second stack structure 70 on a second pattern structure 16, a second capacitor electrode 96 disposed in parallel with the first capacitor electrode 91, a first separation insulating layer 92 disposed on an outer side surface and a lower surface of the first capacitor electrode 91, a second separation insulating layer 97 disposed on an outer side surface and a lower surface of the second capacitor electrode 96, a first capacitor stud 93 contacting the first capacitor electrode 91 and electrically connected to the first capacitor electrode 91, and a second capacitor stud 98 contacting and electrically connected to the second capacitor electrode 96.

Each of the semiconductor chips 2200 may include a through-wiring electrically connected to the peripheral wirings 3110 of the first semiconductor structure 3100 and extending into the second semiconductor structure 3200. The through-wiring may disposed outside the gate stack structure 3210, and may be further disposed to pass through the gate stack structure 3210. Each of the semiconductor chips 2200 may further include an input/output pad 2210 electrically connected to the peripheral wirings 3110 of the first semiconductor structure 3100 (refer to FIG. 11).

According to an embodiment of the present disclosure, a stable and high-capacity vertical capacitor may be provided.

Various advantages and effects of the present disclosure are not limited to the above.

While example embodiments have been illustrated and described above, it will be apparent to those skilled in the art that modifications and variations could be made without departing from the scope of the present disclosure.

What is claimed is:

1. A semiconductor device comprising:
a first structure including a peripheral circuit; and
a second structure disposed on the first structure,
wherein the second structure comprises:
a stack structure including a first stack structure and a second stack structure;
separation structures passing through the first stack structure;
a memory vertical structure disposed between the separation structures and passing through the first stack structure; and
a capacitor including a first capacitor electrode and a second capacitor electrode, passing through the second stack structure, the first and second capacitor electrodes extend parallel to each other,
wherein the first stack structure comprises gate electrodes spaced apart from each other and stacked in a first direction, and interlayer insulating layers alternately stacked with the gate electrodes,
wherein the second stack structure comprises first insulating layers spaced apart from each other and stacked in the first direction, and second insulating layers alternately stacked with the first insulating layers,
wherein each of the first and second capacitor electrodes has a linear shape extending in a second direction that is perpendicular to the first direction in a plan view,
wherein the first insulating layers comprise a different material than the second insulating layers, and
wherein the second insulating layers comprise a same material as the interlayer insulating layers.

2. The semiconductor device of claim 1, wherein an upper surface of the first capacitor electrode and an upper surface of the second capacitor electrode are disposed on a higher level than a level of an upper surface of the memory vertical structure.

3. The semiconductor device of claim 1, further comprising:
a first separation insulating layer including a first barrier layer covering a side surface and a lower surface of the first capacitor electrode, and a second barrier layer covering a side surface and a lower surface of the first barrier layer; and
a second separation insulating layer including a third barrier layer covering a side surface and a lower surface of the second capacitor electrode and a fourth barrier layer covering a side surface and a lower surface of the third barrier layer,
wherein a dielectric of the capacitor disposed between the first capacitor electrode and the second capacitor electrode includes a portion of the second stack structure disposed between the first capacitor electrode and the second capacitor electrode, a portion of the first separation insulating layer covering a side surface of the first capacitor electrode facing the second capacitor electrode, and a portion of the second separation insulating layer covering a side surface of the second capacitor electrode facing the first capacitor electrode.

4. The semiconductor device of claim 1, further comprising:
a bit line stud disposed on the memory vertical structure and contacting the memory vertical structure;
a first capacitor stud disposed on the first capacitor electrode and contacting the first capacitor electrode; and a second capacitor stud disposed on the second capacitor electrode and contacting the second capacitor electrode, wherein an upper surface of the bit line stud is coplanar with upper surfaces of the first and second capacitor studs.

5. The semiconductor device of claim 1, wherein:
the first structure comprises a substrate, the peripheral circuit disposed on the substrate, and a pattern structure disposed on a higher level than that of the peripheral circuit and including at least one silicon layer,
wherein the pattern structure comprises a first pattern structure and a second pattern structure that are spaced apart from each other,
wherein the first stack structure is disposed on the first pattern structure,
the second stack structure is disposed on the second pattern structure, and
the memory vertical structure directly contacts the first pattern structure.

6. The semiconductor device of claim 5, wherein:
the first pattern structure comprises a first pattern layer, a second pattern layer on the first pattern layer, and a third pattern layer on the second pattern layer,
wherein the memory vertical structure passes through the second and third pattern layers and extends into the first pattern layer, and
the memory vertical structure comprises an insulating gap-fill layer, a channel layer covering a side surface and a lower surface of the insulating gap-fill layer, a pad material layer disposed on the insulating gap-fill layer and contacting the channel layer, and a data storage structure covering at least an outer side surface of the channel layer,
wherein the data storage structure comprises a first dielectric layer, a second dielectric layer, and an information storage layer disposed between the first and second dielectric layers, and
the second pattern layer passes through the data storage structure and directly contacts the channel layer.

7. The semiconductor device of claim 6, wherein the second pattern structure comprises a fourth pattern layer disposed on a same level as a level of the first pattern layer, a fifth pattern layer on the fourth pattern layer, and a sixth pattern layer on the fifth pattern layer,
wherein each of the first capacitor electrode and the second capacitor electrode passes through at least the sixth pattern layer,
the second pattern layer comprises a silicon layer, and
the fifth pattern layer comprises an insulating material that is different from a material of the second pattern layer.

8. The semiconductor device of claim 5, further comprising:
a first ground pattern disposed below the first pattern structure, the first ground pattern is grounded to the substrate; and
a second ground pattern disposed below the second pattern structure, the second ground pattern is grounded to the substrate.

9. The semiconductor device of claim 5, further comprising:
a through-region passing through the first stack structure;
a dam structure disposed to surround the through-region; and
a through-contact plug passing through the through-region,
wherein the dam structure comprises a same material as the first and second capacitor electrodes.

10. The semiconductor device of claim 9, wherein upper surfaces of the first and second capacitor electrodes are coplanar with an upper surface of the dam structure.

11. The semiconductor device of claim 1, wherein the first stack structure comprises a first lower stack structure and a first upper stack structure disposed on the first lower stack structure.

12. The semiconductor device of claim 11, wherein a side surface of the memory vertical structure comprises a side slope change portion having a slope that is changed on a height level between an uppermost gate electrode among gate electrodes of the first lower stack structure and a lowermost gate electrode among gate electrodes of the first upper stack structure.

13. The semiconductor device of claim 11, wherein:
the second stack structure comprises a second lower stack structure disposed on a same height level as that of the first lower stack structure, and a second upper stack structure disposed on the second lower stack structure,
wherein a side surface of each of the first and second capacitor electrodes comprises a side slope change portion having a slope that is changed on a height level between an uppermost first insulating layer among first insulating layers of the second lower stack structure and a lowermost first insulating layer among first insulating layers of the second upper stack structure.

14. The semiconductor device of claim 11, wherein:
the first insulating layers are disposed on a same level as the gate electrodes of the first lower stack structure; and
the second insulating layers are disposed on a same level as the interlayer insulating layers of the first lower stack structure.

15. A semiconductor device comprising:
a substrate;
a peripheral circuit on the substrate;
a lower insulating layer covering the peripheral circuit on the substrate;
a pattern structure including a first pattern structure disposed on the lower insulating layer, and a second pattern structure spaced apart from the first pattern structure, and disposed on the lower insulating layer;
a first stack structure including interlayer insulating layers and gate electrodes, alternately stacked on the first pattern structure, the gate electrodes are spaced apart from each other in a first direction that is perpendicular to the first pattern structure in a first region, and including gate pads arranged in a step shape in a second region adjacent to the first region;
a memory vertical structure passing through the first stack structure in the first region, and contacting the first pattern structure;
a first capacitor electrode and a second capacitor electrode disposed on the second pattern structure, the first and second capacitor electrodes extend parallel to each other;
a first separation insulating layer covering a side surface and a lower surface of the first capacitor electrode and separating the first capacitor electrode from the second pattern structure; and
a second separation insulating layer covering a side surface and a lower surface of the second capacitor electrode and separating the second capacitor electrode from the second pattern structure,
wherein the first pattern structure comprises a first ground pattern disposed in a lower portion of the first pattern structure and passing through at least a portion of the lower insulating layer, the first pattern structure is grounded to the substrate, the second pattern structure comprises a second ground pattern disposed in a lower portion of the second pattern structure and passing through at least a portion of the lower insulating layer, the second pattern structure is grounded to the substrate, the first pattern structure comprises a first pattern layer, a second pattern layer on the first pattern layer, and a third pattern layer on the second pattern layer, and the second pattern structure comprises a fourth pattern layer, a fifth pattern layer on the fourth pattern layer, and a sixth pattern layer on the fifth pattern layer, wherein the first and fourth pattern layers are disposed on a same height level and comprise the same material, the fifth pattern layer comprises a different material from that of the second pattern layer, the third and sixth pattern layers comprise a same material, the memory vertical structure passes through at least the second and third pattern layers, and the first and second capacitor electrodes pass through at least the sixth pattern layer.

16. The semiconductor device of claim 15, further comprising:
a second stack structure on the second pattern structure,
wherein the second stack structure comprises first insulating layers and second insulating layers alternately stacked with the first insulating layers,
the first and second capacitor electrodes pass through the second stack structure,
a portion of the second stack structure including the first and second insulating layers, a portion of the first separation insulating layer, and a portion of the second separation insulating layer are disposed between the first and second capacitor electrodes,
the first insulating layers and the second insulating layers comprise different materials,
the second insulating layers comprise a same material as the interlayer insulating layers, and
each of the first and second capacitor electrodes has a linear shape extending in a second direction that is perpendicular to the first direction.

17. The semiconductor device of claim 16, further comprising:
a through-region disposed to be spaced apart from the gate electrodes in the second region and including horizontal insulating layers alternately stacked with the interlayer insulating layers;
a dam structure disposed to surround the through-region; and
a through-contact plug passing through the through-region,
wherein an upper surface of the dam structure is coplanar with an upper surface of each of the first and second capacitor electrodes.

18. The semiconductor device of claim 15, wherein an upper surface of each of the first and second capacitor electrodes is disposed on a position that is higher than an upper surface of the memory vertical structure.

19. The semiconductor device of claim 15, further comprising:
a third pattern structure disposed on the lower insulating layer and spaced apart from the first and second pattern structures;
a third stack structure including third insulating layers and fourth insulating layers that are alternately stacked on the third pattern structure;
a third capacitor electrode and a fourth capacitor electrode, passing through the third stack structure and extending parallel to each other on the third pattern structure;
a third separation insulating layer covering a side surface and a lower surface of the third capacitor electrode and separating the third capacitor electrode from the third pattern structure; and
a fourth separation insulating layer covering a side surface and a lower surface of the fourth capacitor electrode and separating the fourth capacitor electrode from the third pattern structure,
wherein the third insulating layers and the fourth insulating layers comprise different materials,
the fourth insulating layers comprise a same material as the interlayer insulating layers,
each of the third and fourth capacitor electrodes has a linear shape extending in a second direction, perpendicular to the first direction.

* * * * *